(12) United States Patent
Kikitsu et al.

(10) Patent No.: US 10,699,979 B2
(45) Date of Patent: Jun. 30, 2020

(54) ELECTRONIC DEVICE

(71) Applicant: KABUSHIKI KAISHA TOSHIBA, Tokyo (JP)

(72) Inventors: Akira Kikitsu, Kanagawa (JP); Yoshinari Kurosaki, Kanagawa (JP); Kenichiro Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/299,462

(22) Filed: Mar. 12, 2019

(65) Prior Publication Data

US 2020/0066608 A1    Feb. 27, 2020

(30) Foreign Application Priority Data

Aug. 24, 2018   (JP) ................. 2018-157482

(51) Int. Cl.

| | |
|---|---|
| *H01L 23/29* | (2006.01) |
| *H01L 23/552* | (2006.01) |
| *H05K 9/00* | (2006.01) |
| *H05K 1/02* | (2006.01) |
| *G11B 5/708* | (2006.01) |
| *H01L 23/31* | (2006.01) |

(52) U.S. Cl.
CPC .............. *H01L 23/29* (2013.01); *G11B 5/708* (2013.01); *H01L 23/3128* (2013.01); *H01L 23/552* (2013.01); *H05K 1/02* (2013.01); *H05K 9/0088* (2013.01)

(58) Field of Classification Search
CPC ... H01L 23/29; H01L 23/3128; H01L 23/552; H05K 1/02; H05K 9/0088; G11B 5/708
USPC ......................................................... 257/788
See application file for complete search history.

(56) References Cited

U.S. PATENT DOCUMENTS 10,109,332 B2 * 10/2018 Shimizu .................. G11C 11/18
2013/0256819 A1   10/2013 Watanabe et al.
(Continued)

FOREIGN PATENT DOCUMENTS

| JP | 2012-33764 A | 2/2012 |
|---|---|---|
| JP | 2012-38807 A | 2/2012 |
| JP | 2013-153041 A | 8/2013 |

(Continued)

*Primary Examiner* — Tu-Tu V Ho
(74) *Attorney, Agent, or Firm* — Finnegan, Henderson, Farabow, Garrett & Dunner, L.L.P.

(57) ABSTRACT

According to one embodiment, an electronic device includes first to third members, first and second elements. The second member is between the first and third members. The first element is between the first and second members. The second element is between the second and third members. The first member includes first nonmagnetic layers and a first magnetic layer. The first magnetic layer is provided between one of the first nonmagnetic layers and an other one of the first nonmagnetic layers. The second member includes second nonmagnetic layers and a second magnetic layer. The second magnetic layer is provided between one of the second nonmagnetic layers and an other one of the second nonmagnetic layers. The third member includes third nonmagnetic layers and a third magnetic layer. The third magnetic layer is provided between one of the third nonmagnetic layers and an other one of the third nonmagnetic layers.

20 Claims, 15 Drawing Sheets

(56) References Cited

U.S. PATENT DOCUMENTS

2018/0337139 A1  11/2018  Kikitsu et al.
2019/0081007 A1  3/2019  Iwasaki et al.

FOREIGN PATENT DOCUMENTS

| JP | 2013-207059 A | 10/2013 |
| JP | 2017-143210 A | 8/2017 |
| JP | 2018-195660 A | 12/2018 |
| JP | 2019-54059 | 4/2019 |

* cited by examiner

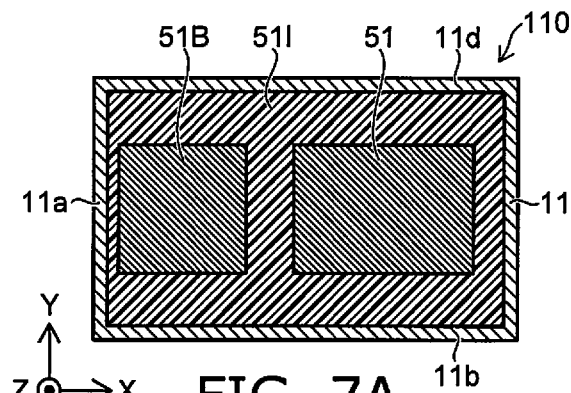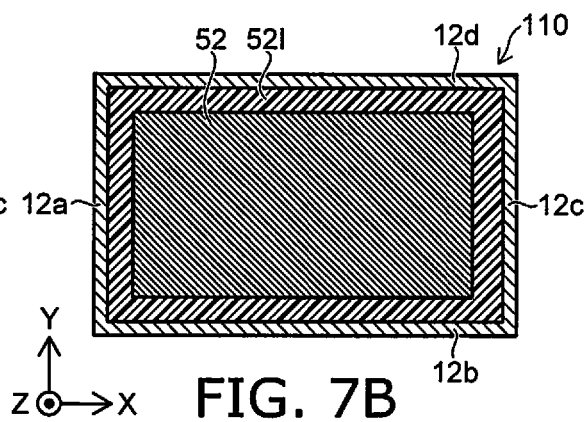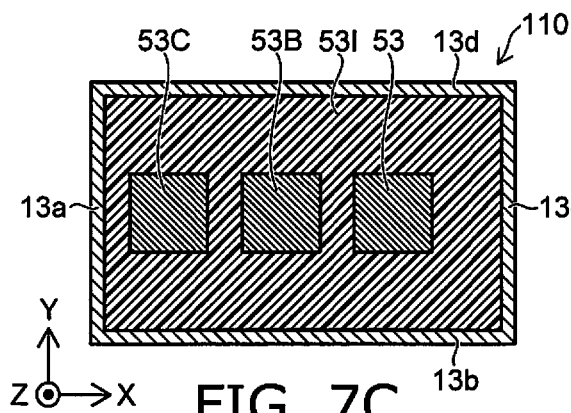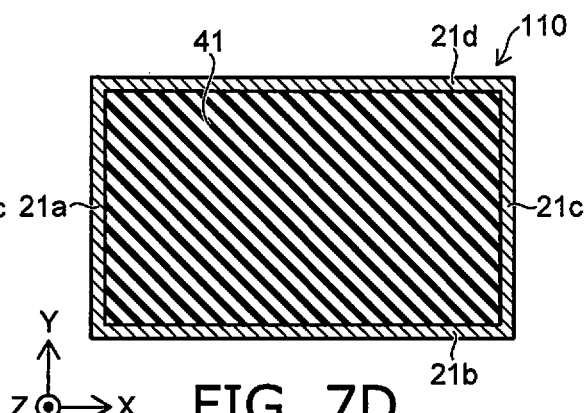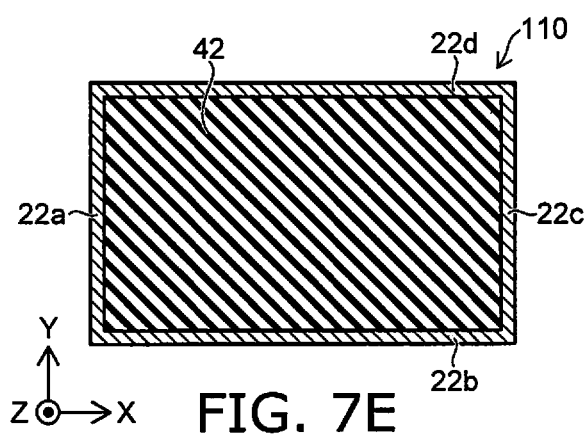

ELECTRONIC DEVICE

CROSS-REFERENCE TO RELATED APPLICATIONS

This application is based upon and claims the benefit of priority from Japanese Patent Application No. 2018-157482, filed on Aug. 24, 2018; the entire contents of which are incorporated herein by reference.

FIELD

Embodiments described herein relate generally to an electronic device.

BACKGROUND

For example, there is an electronic device including a semiconductor element and a shield layer. Electromagnetic waves that are radiated from the semiconductor element are shielded by the shield layer. Stable operations are obtained by suppressing effects of the electromagnetic waves.

BRIEF DESCRIPTION OF THE DRAWINGS

FIG. 7A to FIG. 7E are schematic cross-sectional views illustrating the electronic device according to the first embodiment;

DETAILED DESCRIPTION

Figure 1A:
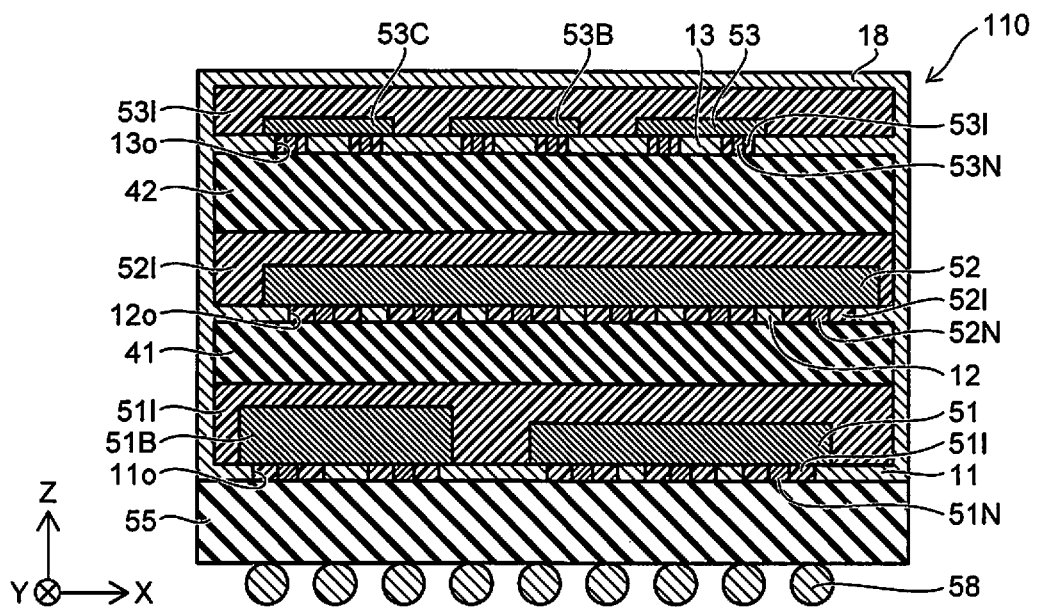
FIG. 1A to FIG. 1E are schematic views illustrating an electronic device according to a first embodiment.

According to one embodiment, an electronic device includes first to third members, a first element, and a second element. A direction from the first member toward the third member is along a first direction. The second member is between the first member and the third member in the first direction. The first element is between the first member and the second member in the first direction. The second element is between the second member and the third member in the first direction. The first member includes a plurality of first nonmagnetic layers and a first magnetic layer. The first nonmagnetic layers are conductive. The first magnetic layer is provided between one of the first nonmagnetic layers and an other one of the first nonmagnetic layers. A direction from the one of the first nonmagnetic layers toward the other one of the first nonmagnetic layers is along the first direction. The second member includes a plurality of second nonmagnetic layers and a second magnetic layer. The second nonmagnetic layers are conductive. The second magnetic layer is provided between one of the second nonmagnetic layers and an other one of the second nonmagnetic layers. A direction from the one of the second nonmagnetic layers toward the other one of the second nonmagnetic layers is along the first direction. The third member includes a plurality of third nonmagnetic layers and a third magnetic layer. The third nonmagnetic layers are conductive. The third magnetic layer is provided between one of the third nonmagnetic layers and an other one of the third nonmagnetic layers. A direction from the one of the third nonmagnetic layers toward the other one of the third nonmagnetic layers is along the first direction.

According to another embodiment, an electronic device includes a first member, a second member, a first element, and a first insulating member. A direction from the first member toward the second member is along a first direction. The first element is between the first member and the second member in the first direction. The first insulating member is between the first member and the first element in the first direction. The first member includes a plurality of first nonmagnetic layers and a first magnetic layer. The first nonmagnetic layers are conductive. The first magnetic layer is provided between one of the first nonmagnetic layers and an other one of the first nonmagnetic layers. A direction from the one of the first nonmagnetic layers toward the other one of the first nonmagnetic layers is along the first direction. The second member includes a plurality of second nonmagnetic layers and a second magnetic layer. The second nonmagnetic layers are conductive. The second magnetic layer is provided between one of the second nonmagnetic layers and an other one of the second nonmagnetic layers. A direction from the one of the second nonmagnetic layers toward the other one of the second nonmagnetic layers is along the first direction.

According to another embodiment, an electronic device includes a first member, a second member, a first element, and a second element. A direction from the first member toward the second member is along a first direction. A direction from the second element toward the first element crosses the first direction. The first element is between a portion of the first member and a portion of the second member in the first direction. The second element is between an other portion of the first member and an other portion of the second member in the first direction. The first member includes a plurality of first nonmagnetic layers and a first magnetic layer. The first nonmagnetic layers are conductive. The first magnetic layer is provided between one of the first nonmagnetic layers and an other one of the first nonmagnetic layers. A direction from the one of the first nonmagnetic layers toward the other one of the first nonmagnetic layers is along the first direction. The second member includes a plurality of second nonmagnetic layers and a second magnetic layer. The second nonmagnetic layers are conductive. The second magnetic layer is provided between one of the second nonmagnetic layers and an other one of the second nonmagnetic layers. A direction from the one of the second nonmagnetic layers toward the other one of the second nonmagnetic layers is along the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1A to FIG. 1E are schematic views illustrating an electronic device according to a first embodiment. FIG. 1A is a cross-sectional view. FIG. 1B to FIG. 1E are plan views of multiple portions included in the electronic device.

As shown in FIG. 1A, the electronic device 110 according to the embodiment includes first to third members 11 to 13, a first element 51, and a second element 52. A third element 53 and a member 18 are further provided in the example. Elements 51B, 53B, and 53C may be further provided. These elements are, for example, semiconductor elements.

The direction from the first member 11 toward the third member 13 is aligned with a first direction. The second member 12 is between the first member 11 and the third member 13 in the first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The first element 51 is between the first member 11 and the second member 12 in the first direction. The second element 52 is between the second member 12 and the third member 13 in the first direction.

The third member 13 is between the second element 52 and the third element 53 in the first direction. The third element 53 is between the third member 13 and the member 18 in the first direction.

The element 51B is between the first member 11 and the second member 12 in the first direction. The elements 53B and 53C are between the third member 13 and the member 18 in the first direction. The number of elements provided between the multiple members is arbitrary.

Figure 1B:
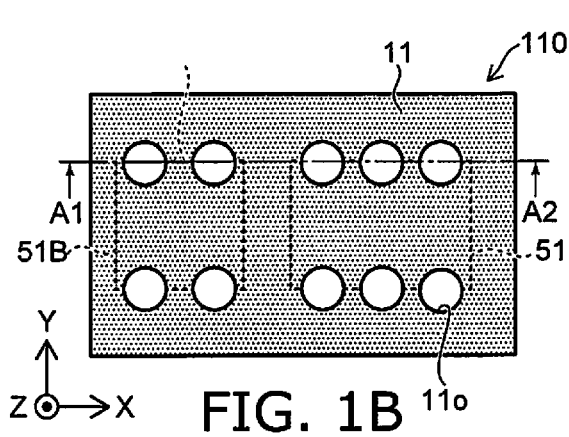
Figure 1C:
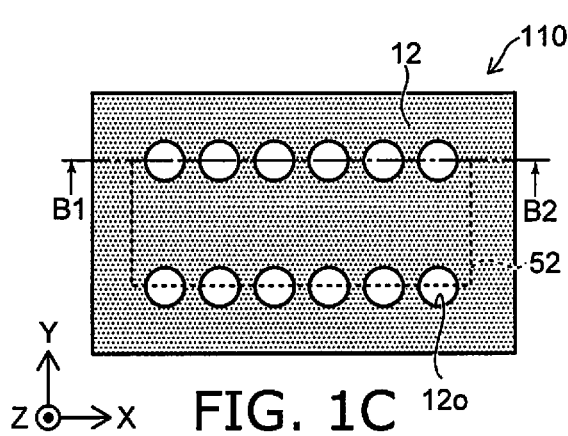
Figure 1D:
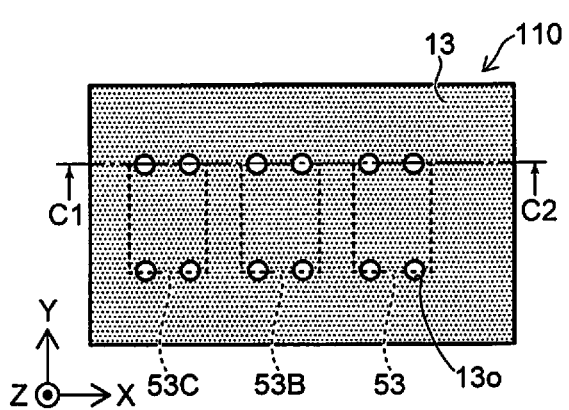
Figure 1E:
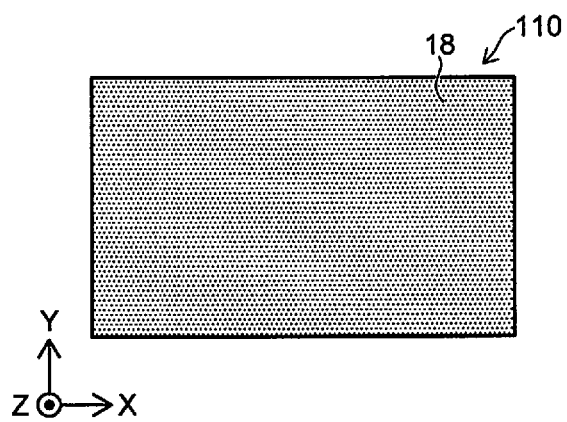

FIG. 1B is a plan view of the first member 11. FIG. 1C is a plan view of the second member 12. FIG. 1D is a plan view of the third member 13. FIG. 1E is a plan view of the member 18. As shown in these drawings, the first to third members 11 to 13 each may have holes (holes 11o, 12o, and 13o). For example, electrical connections are performed via the holes.

FIG. 1A is a cross-sectional view along line A1-A2 of FIG. 1B, line B1-B2 of FIG. 1C, and line C1-C2 of FIG. 1D.

A first base material 41 and a second base material 42 are further provided in the example. The first base material 41 is between the first element 51 and the second member 12 in the first direction (the Z-axis direction). The second base material 42 is between the second element 52 and the third member 13 in the first direction. The first base material 41 and the second base material 42 are, for example, substrates. The first base material 41 and the second base material 42 are, for example, interposers.

For example, the second member 12 contacts the first base material 41. For example, the second member 12 may be provided at the surface of the first base material 41. The second element 52 may be fixed at the first base material 41 where the second member 12 is provided.

A first insulating member 51I is provided between the first base material 41 and the first element 51. A second insulating member 52I is provided between the second base material 42 and the second element 52. A third insulating member 53I is provided between the member 18 and the third element 53. The first insulating member 51I, the second insulating member 52I, and the third insulating member 53I are, for example, resins (e.g., sealing resins).

A base body 55 is further provided in the example. The first member 11 is provided between the base body 55 and the first element 51. In the example, a connection portion 58 is provided at the base body 55. The base body 55 is provided between the connection portion 58 and the first element 51. The connection portion 58 is, for example, bumps (e.g., solder bumps).

A first connection member 51N is provided between the first element 51 and the base body 55. The first connection member 51N overlaps the hole 11o of the first member 11. The first connection member 51N electrically connects the first element 51 and the base body 55. For example, the first connection member 51N electrically connects the first element 51 and the connection portion 58 via an interconnect (not illustrated) provided in the base body 55. For example, the interconnect is at least one of provided inside the base body 55 or provided at the surface of the base body 55. A portion of the first insulating member 51I may be provided around the first connection member 51N.

A second connection member 52N is provided between the second element 52 and the first base material 41. The second connection member 52N overlaps the hole 12o of the second member 12. The second connection member 52N electrically connects the second element 52 and the first base material 41. For example, the second connection member 52N electrically connects the second element 52 and an interconnect (not illustrated) provided in the first base material 41. The interconnect is at least one of provided inside the first base material 41 or provided at the surface of the first base material 41. A portion of the second insulating member 52I may be provided around the second connection member 52N.

A third connection member 53N is provided between the third element 53 and the second base material 42. The third connection member 53N overlaps the hole 13o of the third member 13. The third connection member 53N electrically connects the third element 53 and the second base material 42. For example, the third connection member 53N electrically connects the third element 53 and an interconnect (not illustrated) provided in the second base material 42. The interconnect is at least one of provided inside the second base material 42 or provided at the surface of the second base material 42. A portion of the third insulating member 53I may be provided around the third connection member 53N.

The insulating members recited above (the first insulating member 51I, the second insulating member 52I, and the third insulating member 53I) may include, for example, at least one of a resin, a ceramic, or the like. The elements are protected by the insulating members.

The elements (the first to third elements 51 to 53, etc.) include, for example, at least one of an operation circuit, a control circuit, a memory circuit, a switching circuit, a signal processing circuit, or a high frequency circuit.

The first to third members 11 to 13 and the member 18 each include mutually-stacked magnetic layers and nonmagnetic layers. For example, the electromagnetic waves can be attenuated efficiently in the first to third members 11 to 13 and the member 18. For example, the first to third members 11 to 13 and the member 18 function as electromagnetic shields.

For example, the electromagnetic waves that are emitted to the outside from the multiple elements (the first to third elements 51 to 53, etc.) are attenuated by the first to third members 11 to 13 and the member 18. For example, the electromagnetic waves toward the multiple elements (the first to third elements 51 to 53, etc.) from the outside of the electronic device (110) are attenuated by these members. For example, the electromagnetic waves from one of the multiple elements toward another one of the multiple elements are attenuated by these members. According to the embodiment, an electronic device can be provided in which the operations can be more stable.

Examples of the first to third members 11 to 13 and the member 18 will now be described.

FIG. 2A to FIG. 2D are schematic views illustrating portions of the electronic device according to the first embodiment.

FIG. 2A to FIG. 2D are cross-sectional views respectively of the first to third members 11 to 13 and the member 18.

Figure 2A:
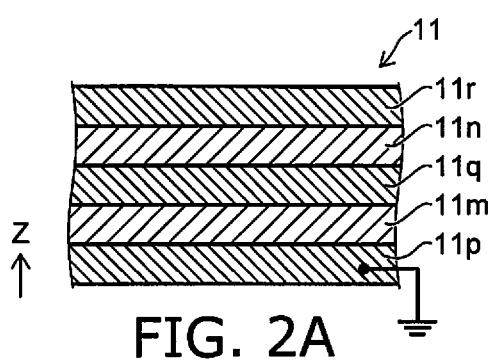
FIG. 2A to FIG. 2D are schematic views illustrating portions of the electronic device according to the first embodiment.

As shown in FIG. 2A, the first member 11 includes multiple conductive first nonmagnetic layers (a nonmagnetic layer 11$p$ and a nonmagnetic layer 11$q$) and a magnetic layer 11$m$. The magnetic layer urn is provided between one of the multiple first nonmagnetic layers (the nonmagnetic layer 11$p$) and another one of the multiple first nonmagnetic layers (the nonmagnetic layer 11$q$). The direction from the one of the multiple first nonmagnetic layers recited above toward the other one of the multiple first nonmagnetic layers recited above is aligned with the first direction (the Z-axis direction). For example, the magnetic layer 11$m$ contacts the nonmagnetic layer 11$p$ and the nonmagnetic layer 11$q$.

In the example, the multiple conductive first nonmagnetic layers further include a nonmagnetic layer 11$r$. A magnetic layer 11$n$ may be further provided. The magnetic layer 11$n$ is provided between the nonmagnetic layer 11$q$ and the nonmagnetic layer 11$r$. The nonmagnetic layer 11$r$ and the magnetic layer 11$n$ may be omitted.

Figure 2B:
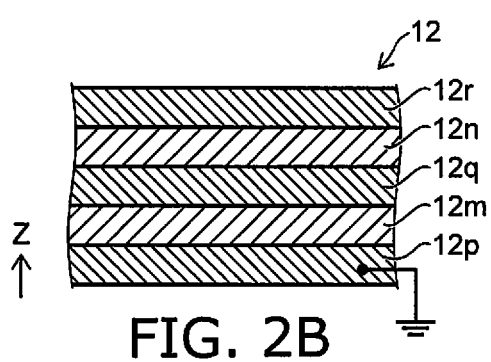

As shown in FIG. 2B, the second member 12 includes multiple conductive second nonmagnetic layers (a nonmagnetic layer 12$p$ and a nonmagnetic layer 12$q$) and a magnetic layer 12$m$. The magnetic layer 12$m$ is provided between one of the multiple second nonmagnetic layers (the nonmagnetic layer 12$p$) and another one of the multiple second nonmagnetic layers (the nonmagnetic layer 12$q$). The direction from the one of the multiple second nonmagnetic layers recited above toward the other one of the multiple second nonmagnetic layers recited above is aligned with the first direction. For example, the magnetic layer 12$m$ contacts the nonmagnetic layer 12$p$ and the nonmagnetic layer 12$q$.

In the example, the multiple conductive second nonmagnetic layers further include a nonmagnetic layer 12$r$. A magnetic layer 12$n$ may be further provided. The magnetic layer 12$n$ is provided between the nonmagnetic layer 12$q$ and the nonmagnetic layer 12$r$. The nonmagnetic layer 12$r$ and the magnetic layer 12$n$ may be omitted.

Figure 2C:
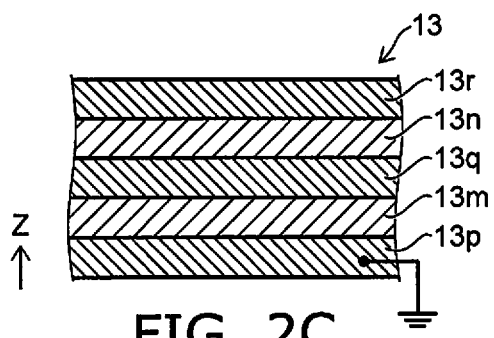

As shown in FIG. 2C, the third member 13 includes multiple conductive third nonmagnetic layers (a nonmagnetic layer 13$p$ and a nonmagnetic layer 13$q$) and a magnetic layer 13$m$. The magnetic layer 13$m$ is provided between one of the multiple third nonmagnetic layers (the nonmagnetic layer 13$p$) and another one of the multiple third nonmagnetic layers (the nonmagnetic layer 13$q$). The direction from the one of the multiple third nonmagnetic layers recited above toward the other one of the multiple third nonmagnetic layers recited above is aligned with the first direction. For example, the magnetic layer 13$m$ contacts the nonmagnetic layer 13$p$ and the nonmagnetic layer 13$q$.

In the example, the multiple conductive third nonmagnetic layers further include a nonmagnetic layer 13$r$. A magnetic layer 13$n$ may be further provided. The magnetic layer 13$n$ is provided between the nonmagnetic layer 13$q$ and the nonmagnetic layer 13$r$. The nonmagnetic layer 13$r$ and the magnetic layer 13$n$ may be omitted.

Figure 2D:
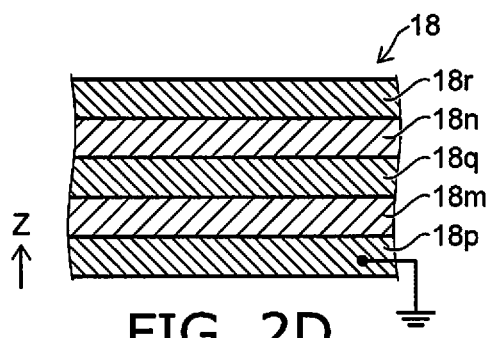

As shown in FIG. 2D, the member 18 includes multiple conductive nonmagnetic layers (a nonmagnetic layer 18$p$ and a nonmagnetic layer 18$q$) and a magnetic layer 18$m$. The magnetic layer 18$m$ is provided between one of the multiple nonmagnetic layers (the nonmagnetic layer 18$p$) and another one of the multiple nonmagnetic layers (the nonmagnetic layer 18$q$). The direction from the one of the multiple nonmagnetic layers recited above toward the other one of the multiple nonmagnetic layers recited above is aligned with the first direction. For example, the magnetic layer 18$m$ contacts the nonmagnetic layer 18$p$ and the nonmagnetic layer 18$q$.

In the example, the multiple conductive nonmagnetic layers of the member 18 further include a nonmagnetic layer 18$r$. A magnetic layer 18$n$ may be further provided. The magnetic layer 18$n$ is provided between the nonmagnetic layer 18$q$ and the nonmagnetic layer 18$r$. The nonmagnetic layer 18$r$ and the magnetic layer 18$n$ may be omitted.

The first to third members 11 to 13 and the member 18 may be electrically connected to each other. For example, the first to third members 11 to 13 and the member 18 may be connected to an electric potential (e.g., a ground potential).

The nonmagnetic layers (the nonmagnetic layers lip to 11$r$, 12$p$ to 12$r$, 13$p$ to 13$r$, and 18$p$ to 18$r$, etc.) include, for example, at least one selected from the group consisting of Cu, Al, and Ag.

At least a portion of at least one (e.g., the first magnetic layer) of the magnetic layers (the magnetic layers 11$m$, 12$m$, 13$m$, and 18$m$) includes $Fe_{100-x1-x2}\alpha_{x1}N_{x2}$. "$\alpha$" includes at least one selected from the group consisting of Zr, Hf, Ta, Nb, Ti, Si, and Al. "x1" is not less than 0.5 and not more than 10. "x2" is not less than 0.5 and not more than 8. For example, "x1" is not less than 0.5 atomic percent and not more than 10 atomic percent. For example, "x2" is not less than 0.5 atomic percent and not more than 8 atomic percent. At least one of the magnetic layers (the magnetic layers 11$m$, 12$m$, 13$m$, and 18$m$) may include, for example, an alloy (e.g., NiFe, CoFe, FeSi, FeZrN, FeCo, etc.) including at least one selected from the group consisting of Co, Ni, and Fe. At least one of the magnetic layers (the magnetic layers 11m, 12m, 13m, and 18m) may include, for example, an amorphous alloy including CoZrNb.

Because the magnetic layers include such materials, the attenuation characteristics of the electromagnetic waves can be improved. For example, a coercivity Hc is small for such materials. Multiple magnetic domains are formed in the magnetic layers. The magnetizations of the multiple magnetic domains are aligned with various directions. Thereby, electromagnetic waves that have magnetic field components in various directions can be attenuated effectively.

The material of one of the magnetic layers 11m, 12m, 13m, or 18m may be different from the material of another of the magnetic layers 11m, 12m, 13m, or 18m. The material of the one of the magnetic layers 11m, 12m, 13m, or 18m may be the same as the material of the other of the magnetic layers 11m, 12m, 13m, or 18m.

As described above, multiple magnetic layers may be provided in one member. For example, the first member 11 may further include another first magnetic layer (the magnetic layer 11n) in addition to the first magnetic layer (the magnetic layer 11m). Another one of the multiple first nonmagnetic layers (e.g., the nonmagnetic layer 11q) is between the first magnetic layer (the magnetic layer 11m) and another first magnetic layer (the magnetic layer 11n) in the first direction (the Z-axis direction). In the case where multiple magnetic layers are provided, the interfaces between the nonmagnetic layers and each of the multiple magnetic layers increase. Thereby, a large attenuation of the electromagnetic wave is obtained.

It is favorable for the orientation of the magnetization of the first magnetic layer (the magnetic layer 11m) to cross the orientation of the magnetization of the other first magnetic layer (the magnetic layer 11n). Thereby, electromagnetic waves that have magnetic field components in various directions can be attenuated effectively.

For example, it is favorable for the orientation of the magnetization of the second magnetic layer (the magnetic layer 12m) to cross the orientation of the magnetization of another second magnetic layer (the magnetic layer 12n). It is favorable for the orientation of the magnetization of the third magnetic layer (the magnetic layer 13m) to cross the orientation of the magnetization of another third magnetic layer (the magnetic layer 13n). It is favorable for the orientation of the magnetization of the magnetic layer 18m to cross the orientation of the magnetization of the magnetic layer 18n.

Examples of the components (the base body, the base materials, the connection members, the insulating layers, etc.) included in the electronic device will now be described. In the description recited below, "substrate," "electrode," "connection member," and "insulating layer" are examples. For example, the "electrode" may include at least one selected from the group consisting of at least a portion of a conductive layer, at least a portion of an interconnect, at least a portion of a contact plug, at least a portion of a via plug, and at least a portion of a terminal (a pin, etc.). For example, the "connection member" may include at least one selected from the group consisting of at least a portion of a conductive layer, at least a portion of an interconnect, at least a portion of a contact plug, and at least a portion of a via plug. Hereinbelow, the case is described where the "electrode" has a layer configuration.

Figure 3A:
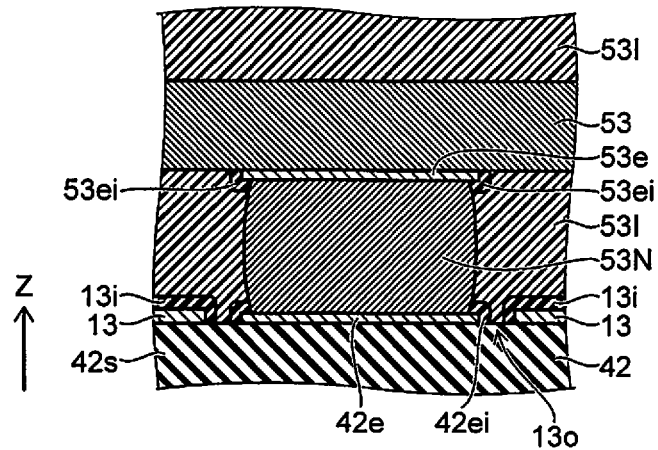
FIG. 3A to FIG. 3C are schematic cross-sectional views illustrating portions of the electronic device according to the first embodiment.
Figure 3B:
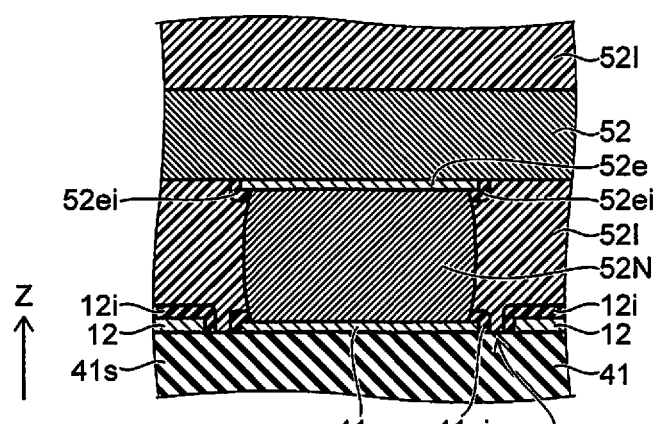
Figure 3C:
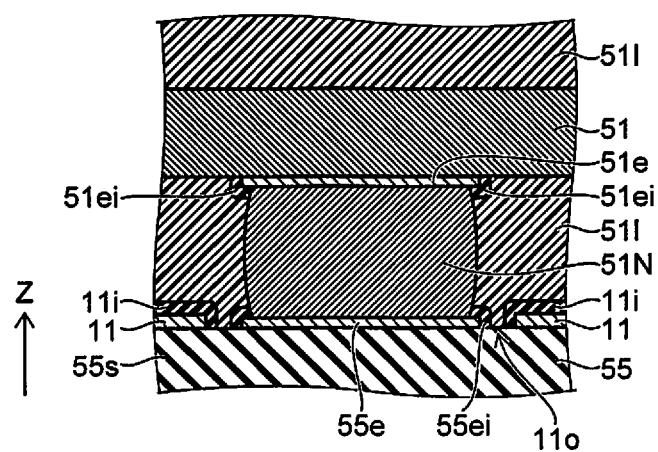

FIG. 3A to FIG. 3C are schematic cross-sectional views illustrating portions of the electronic device according to the first embodiment.

As shown in FIG. 3A, the second base material 42 includes a second base material electrode 42e. For example, the second base material 42 includes a second substrate 42s, and the second base material electrode 42e provided at the second substrate 42s. For example, the third member 13 is provided at the second base material 42. The third member 13 has the hole 13o. The third element 53 includes a third element electrode 53e. The third connection member 53N electrically connects the second base material electrode 42e and the third element 53 (the third element electrode 53e) via the hole 13o.

In the example, the second base material 42 further includes a second base material insulating layer 42ei. The second base material insulating layer 42ei is between the third member 13 and the third element 53 and between the second base material electrode 42e and the third member 13.

For example, a third member insulating layer 13i may be further provided. The third member insulating layer 13i is provided between the third member 13 and the third element 53. For example, a third element insulating layer 53ei may be further provided. A portion of the third element electrode 53e is provided between the third element insulating layer 53ei and the third element 53. Electrical shorts between the third element 53 (the third element electrode 53e) and the third member 13 can be suppressed by these insulating layers.

The third element 53 is provided between the third insulating member 53I and the third member 13. A portion of the third insulating member 53I may be provided between the third member 13 and the third element 53.

As shown in FIG. 3B, the first base material 41 includes a first base material electrode 41e. For example, the first base material 41 includes a first substrate 41s, and the first base material electrode 41e provided at the first substrate 41s. For example, the second member 12 is provided at the first base material 41. The second member 12 has the hole 12o. The second element 52 includes a second element electrode 52e. The second connection member 52N electrically connects the first base material electrode 41e and the second element 52 (the second element electrode 52e) via the hole 12o.

In the example, the first base material 41 further includes a first base material insulating layer 41ei. The first base material insulating layer 41ei is between the second member 12 and the second element 52 and between the first base material electrode 41e and the second member 12.

For example, a second member insulating layer 12i may be further provided. The second member insulating layer 12i is provided between the second member 12 and the second element 52. For example, a second element insulating layer 52ei may be further provided. A portion of the second element electrode 52e is provided between the second element insulating layer 52ei and the second element 52. Electrical shorts between the second element 52 (the second element electrode 52e) and the second member 12 can be suppressed by these insulating layers.

The second element 52 is provided between the second insulating member 52I and the second member 12. A portion of the second insulating member 52I may be provided between the second member 12 and the second element 52.

As shown in FIG. 3C, the base body 55 includes a base body electrode 55e. For example, the base body 55 includes a substrate 55s, and the base body electrode 55e provided at the substrate 55s. For example, the first member 11 is provided at the base body 55. The first member 11 has the hole 11o. The first element 51 includes a first element electrode 51e. The first connection member 51N electrically connects the base body electrode 55e and the first element 51 (the first element electrode 51e) via the hole 11o.

In the example, the base body 55 further includes a base body insulating layer 55ei. The base body insulating layer 55ei is between the first member 11 and the first element 51 and between the base body electrode 55e and the first member 11.

For example, a first member insulating layer 11l may be further provided. The first member insulating layer 11l is provided between the first member 11 and the first element 51. For example, a first element insulating layer 51ei may be further provided. A portion of the first element electrode 51e is provided between the first element insulating layer 51ei and the first element 51. Electrical shorts between the first element 51 (the first element electrode 51e) and the first member 11 can be suppressed by these insulating layers.

The first element 51 is provided between the first insulating member 51I and the first member 11. A portion of the first insulating member 51I may be provided between the first member 11 and the first element 51.

Examples of characteristics of the electronic device will now be described. Examples of measurement results of the electromagnetic wave attenuation characteristics of the conductive films (e.g., the shield films) used to form the members (e.g., the first to third members 11 to 13, the member 18, etc.) will now be described.

Figure 4:
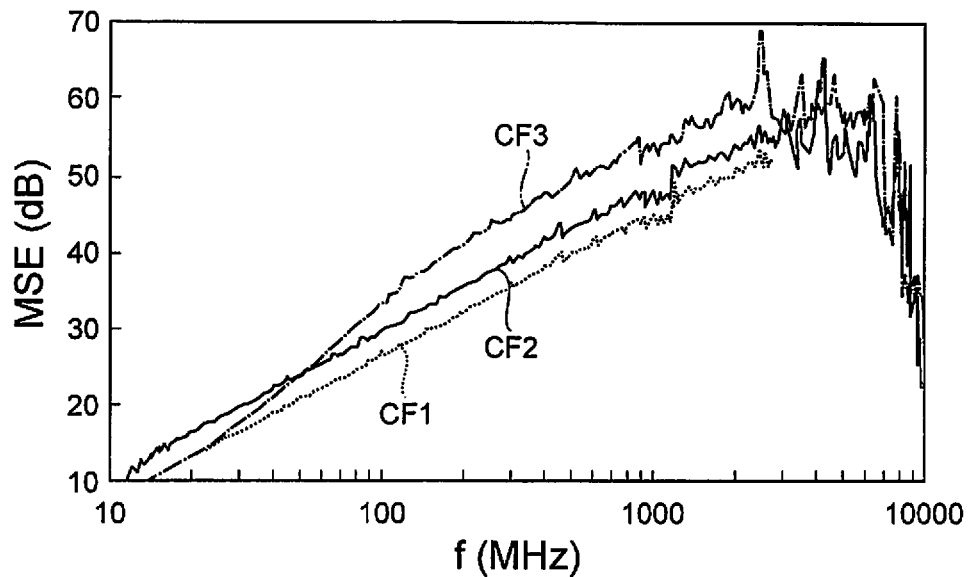
FIG. 4 is a graph illustrating characteristics of a member used in the electronic device.

FIG. 4 is a graph illustrating characteristics of a member used in the electronic device.

The characteristics of first to third samples CF1 to CF3 are illustrated in FIG. 4. In the first sample CF1, the conductive film (e.g., the first member 11) is Cu (2 μm). In the second sample CF2, the conductive film (e.g., the first member 11) is Cu (3 μm). In the third sample CF3, the conductive film (e.g., the first member 11) is Cu (600 nm)/NiFeCuMo (200 nm)/Cu (400 nm)/NiFeCuMo (200 nm)/Cu (600 nm). These samples are formed on a glass substrate. The horizontal axis of FIG. 4 is a frequency f (MHz). The vertical axis is an attenuation performance MSE (dB). A larger numerical value of the attenuation performance MSE corresponds to a larger attenuation amount.

It can be seen from FIG. 4 that a high attenuation performance MSE is obtained for the third sample CF3.

Examples of simulation results of the electromagnetic wave attenuation characteristics of the conductive films used to form the members (e.g., the first to third members 11 to 13, the member 18, etc.) will now be described.

Figure 5:
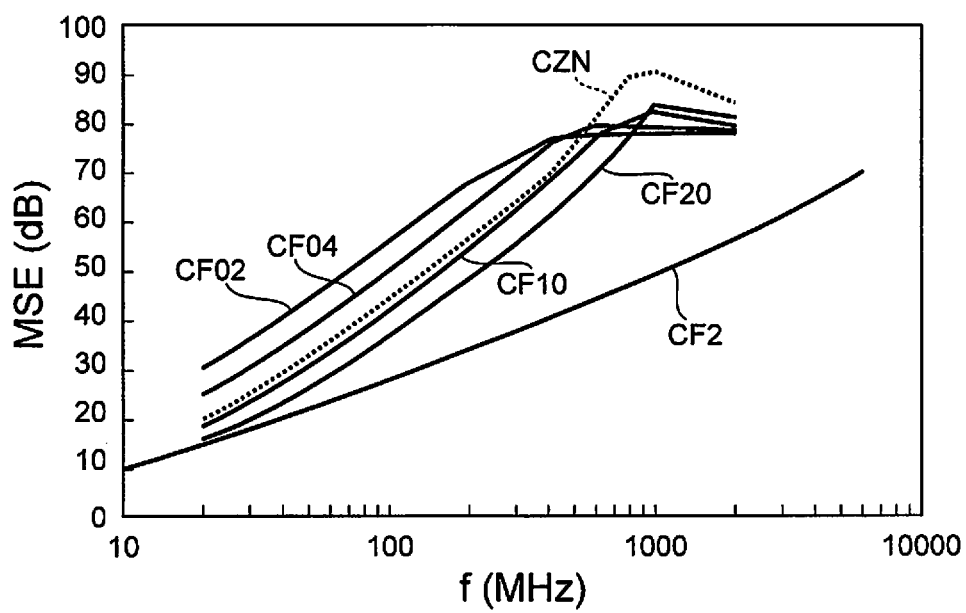
FIG. 5 is a graph illustrating characteristics of the member used in the electronic device.

FIG. 5 is a graph illustrating characteristics of the member used in the electronic device.

In the model of the calculation of the attenuation performance MSE corresponding to the shield performance, the conductive film that is used to form the member (e.g., the first member 11) has a structure of Cu (800 nm)/NiFe (400 nm)/Cu (800 nm). A characteristic CF02, a characteristic CF04, a characteristic CF10, and a characteristic CF20 are respectively based on the theoretical magnetic properties when a magnetic anisotropy field Hk of the NiFe layer is 2 Oe, 4 Oe, 10 Oe, and 20 Oe. For a characteristic CZN, the model of the calculation has a structure in which the conductive film used to form the member (e.g., the first member 11) is Cu (800 nm)/CoZrNb (400 nm)/Cu (800 nm). The characteristic of the second sample CF2 (Cu (2 μm)) described in reference to FIG. 4 also is illustrated in FIG. 5. The horizontal axis of FIG. 5 is the frequency f (MHz). The vertical axis is the attenuation performance MSE (dB).

It can be seen from FIG. 5 that a high attenuation performance MSE is obtained by using a soft magnetic material in the magnetic layer. Various attenuation performance MSE can be obtained by selecting the soft magnetic property of the magnetic layer (the Hk, or using different material).

In the embodiment, compared to the case where the conductive film (the shield film) is Cu, a high attenuation characteristic is obtained even in the case where the conductive film (the shield film) is thin. In the case where multiple elements are stacked, it is particularly favorable for the shield films provided between the multiple elements to be thin. By setting the shield films to be thin, the entire electronic device can be thin. By setting the shield films inserted between the multiple elements to be thin, the connections between the multiple elements are easy. For example, the manufacturing time of the shield films is reduced. The source material consumed amount is small. For example, the manufacturing cost can be lower.

Figure 6A:
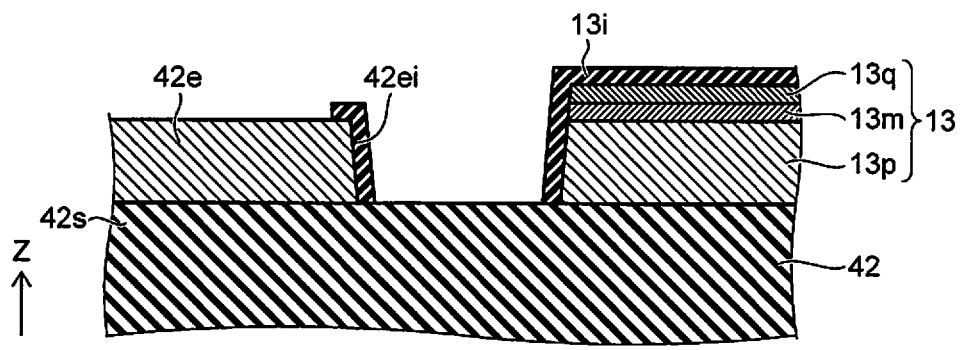
FIG. 6A to FIG. 6C are schematic cross-sectional views illustrating portions of the electronic device according to the first embodiment.
Figure 6B:
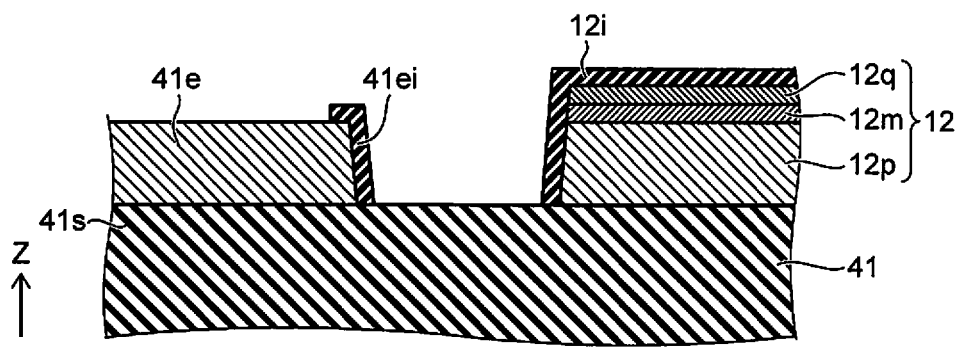
Figure 6C:
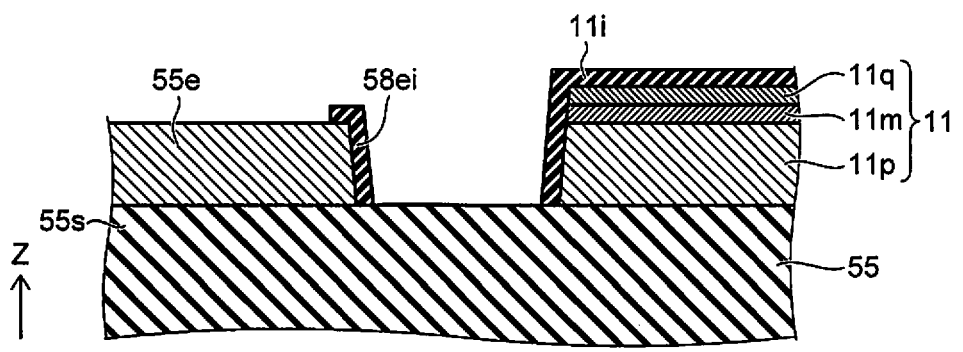

FIG. 6A to FIG. 6C are schematic cross-sectional views illustrating portions of the electronic device according to the first embodiment.

The connection members and the insulating members are not illustrated in FIG. 6A to FIG. 6C.

As shown in FIG. 6A, the second base material 42 includes the second base material electrode 42e. For example, the second base material electrode 42e can be formed by plating (e.g., electroless plating, etc.).

The conductive film that is used to form the second base material electrode 42e may be one of the nonmagnetic layers of the third member 13. In such a case, the thickness of the second base material electrode 42e may be substantially the same as the thickness of one of the multiple third nonmagnetic layers (the nonmagnetic layer 13p). The material of the second base material electrode 42e may be substantially the same as the material of the one of the multiple third nonmagnetic layers (the nonmagnetic layer 13p). The thickness of the second base material electrode 42e may be not less than 0.5 times and not more than 2 times the thickness of the one of the multiple third nonmagnetic layers (the nonmagnetic layer 13p). For example, the absolute value of the difference between the thickness of the second base material electrode 42e and the thickness of the one of the multiple third nonmagnetic layers (the nonmagnetic layer 13p) is not more than ½ of the absolute value of the difference between the thickness of the one of the multiple third nonmagnetic layers (the nonmagnetic layer 13p) and the thickness of another one of the multiple third nonmagnetic layers (the nonmagnetic layer 13q).

As shown in FIG. 6B, the first base material 41 includes the first base material electrode 41e. The conductive film that is used to form the first base material electrode 41e may be one of the nonmagnetic layers of the second member 12. For example, the thickness of the first base material electrode 41e is substantially the same as the thickness of one of the multiple second nonmagnetic layers (the nonmagnetic layer 12p). The material of the first base material electrode 41e is substantially the same as the material of the one of the multiple second nonmagnetic layers (the nonmagnetic layer 12p). The thickness of the first base material electrode 41e may be not less than 0.5 times and not more than 2 times the thickness of the one of the multiple second nonmagnetic layers (the nonmagnetic layer 12p). For example, the absolute value of the difference between the thickness of the first base material electrode 41e and the thickness of the one of the multiple second nonmagnetic layers (the nonmagnetic layer 12p) is not more than ½ of the absolute value of the difference between the thickness of the one of the multiple second nonmagnetic layers recited above (the nonmagnetic layer 12p) and the thickness of another one of the multiple second nonmagnetic layers (the nonmagnetic layer 12q).

As shown in FIG. 6C, the base body 55 includes the base body electrode 55e. The conductive film that is used to form the base body electrode 55e may be one of the nonmagnetic layers of the first member 11. For example, the thickness of the base body electrode 55e is substantially the same as the thickness of one of the multiple first nonmagnetic layers (the nonmagnetic layer 11p). The material of the base body electrode 55e is substantially the same as the material of the one of the multiple first nonmagnetic layers (the nonmagnetic layer 11p). The thickness of the base body electrode 55e may be not less than 0.5 times and not more than 2 times the thickness of the one of the multiple first nonmagnetic layers (the nonmagnetic layer 11p). For example, the absolute value of the difference between the thickness of the base body electrode 55e and the thickness of the one of the multiple first nonmagnetic layers (the nonmagnetic layer 11p) is not more than ½ of the absolute value of the difference between the thickness of the one of the multiple first nonmagnetic layers recited above (the nonmagnetic layer 11p) and the thickness of another one of the multiple first nonmagnetic layers (the nonmagnetic layer 11q).

According to the embodiment, the conductive films (e.g., the shield films) may be provided to face the side surfaces of the elements. Examples of the conductive films (e.g., the shield films) provided at the side surfaces of the elements will now be described.

FIG. 7A to FIG. 7E are schematic cross-sectional views illustrating the electronic device according to the first embodiment.

FIG. 7A is a cross-sectional view of the X-Y plane passing through the first element 51. FIG. 7B is a cross-sectional view of the X-Y plane passing through the second element 52. FIG. 7C is a cross-sectional view of the X-Y plane passing through the third element 53. FIG. 7D is a cross-sectional view of the X-Y plane passing through the first base material 41. FIG. 7E is a cross-sectional view of the X-Y plane passing through the second base material 42.

As shown in FIG. 7A, the electronic device 110 further includes a first side member 11a, a first opposite side member 11c, a first other-side member 11b, and a first opposite other-side member 11d. The first element 51 is between the first side member 11a and the first opposite side member 11c in a second direction (in the example, the X-axis direction) crossing the first direction. The first element 51 is between the first other-side member 11b and the first opposite other-side member 11d in a third direction (in the example, the Y-axis direction) crossing a plane including the first direction and the second direction. For example, the first insulating member 51I is provided between the first element 51 and these members.

As shown in FIG. 7B, the electronic device 110 may further include a second side member 12a, a second opposite side member 12c, a second other-side member 12b, and a second opposite other-side member 12d. The second element 52 is between the second side member 12a and the second opposite side member 12c in the second direction (in the example, the X-axis direction) crossing the first direction. The second element 52 is between the second other-side member 12b and the second opposite other-side member 12d in the third direction (in the example, the Y-axis direction) crossing a plane including the first direction and the second direction. For example, the second insulating member 52I is provided between the second element 52 and these members.

As shown in FIG. 7C, the electronic device 110 may further include a third side member 13a, a third opposite side member 13c, a third other-side member 13b, and a third opposite other-side member 13d. The third element 53 is between the third side member 13a and the third opposite side member 13c in the second direction (in the example, the X-axis direction) crossing the first direction. The third element 53 is between the third other-side member 13b and the third opposite other-side member 13d in the third direction (in the example, the Y-axis direction) crossing a plane including the first direction and the second direction. For example, the third insulating member 53I is provided between the third element 53 and these members.

As shown in FIG. 7D, the electronic device 110 may further include a first base material side member 21a, a first base material opposite side member 21c, a first base material other-side member 21b, and a first base material opposite other-side member 21d. The first base material 41 is between the first base material side member 21a and the first base material opposite side member 21c in the second direction (in the example, the X-axis direction) crossing the first direction. The first base material 41 is between the first base material other-side member 21b and the first base material opposite other-side member 21d in the third direction (in the example, the Y-axis direction) crossing a plane including the first direction and the second direction.

As shown in FIG. 7E, the electronic device 110 may further include a second base material side member 22a, a second base material opposite side member 22c, a second base material other-side member 22b, and a second base material opposite other-side member 22d. The second base material 42 is between the second base material side member 22a and the second base material opposite side member 22c in the second direction (in the example, the X-axis direction) crossing the first direction. The second base material 42 is between the second base material other-side member 22b and the second base material opposite other-side member 22d in the third direction (in the example, the Y-axis direction) crossing a plane including the first direction and the second direction.

For example, the members recited above function as shield films.

FIG. 8A to FIG. 8D are schematic cross-sectional views illustrating portions of the electronic device according to the first embodiment.

These drawings respectively illustrate the first side member 11a, the first opposite side member 11c, the first other-side member 11b, and the first opposite other-side member 11d.

Figure 8A:
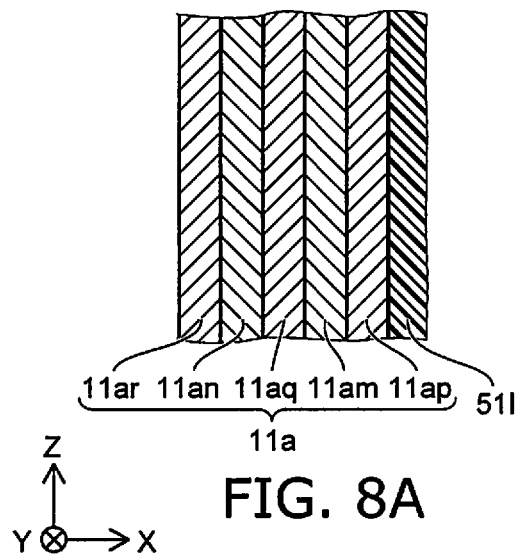
FIG. 8A to FIG. 8D are schematic cross-sectional views illustrating portions of the electronic device according to the first embodiment.

As shown in FIG. 8A, the first side member 11a includes multiple conductive first side nonmagnetic layers (the nonmagnetic layers 11ap, 11aq, and 11ar, etc.), and a first side magnetic layer (a magnetic layer 11am) provided between one of the multiple first side nonmagnetic layers (the nonmagnetic layer 11ap) and another one of the multiple first side nonmagnetic layers (the nonmagnetic layer 11aq). The direction from the one of the multiple first side nonmagnetic layers recited above (the nonmagnetic layer 11ap) toward the other one of the multiple first side nonmagnetic layers recited above (the nonmagnetic layer 11aq) is aligned with the second direction (e.g., the X-axis direction). A magnetic layer 11an may be further provided.

Figure 8B:
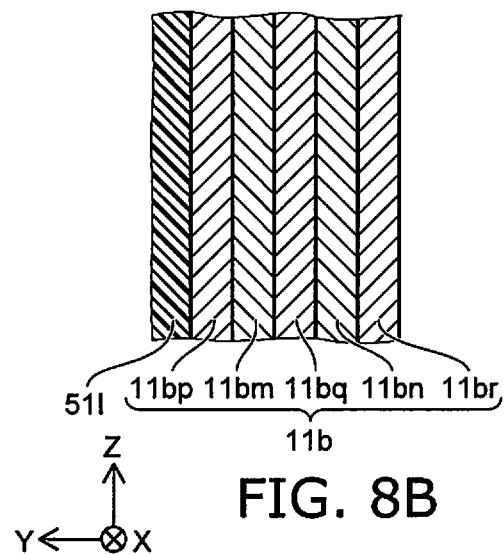
Figure 8C:
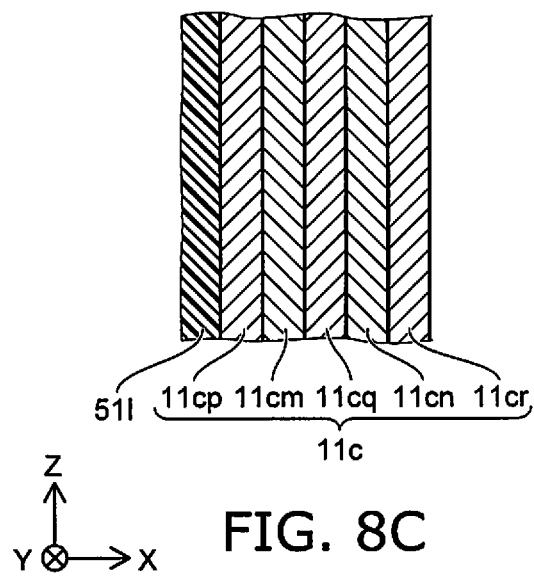

As shown in FIG. 8C, the first opposite side member 11c includes multiple conductive first opposite side nonmagnetic layers (the nonmagnetic layers 11*cp*, 11*cq*, and 11*cr*, etc.), and a first opposite side magnetic layer (a magnetic layer 11*cm*) provided between one of the multiple first opposite side nonmagnetic layers (the nonmagnetic layer 11*cp*) and another one of the multiple first opposite side nonmagnetic layers (the nonmagnetic layer 11*cq*). The direction from the one of the multiple first opposite side nonmagnetic layers recited above (the nonmagnetic layer 11*cp*) toward the other one of the multiple first opposite side nonmagnetic layers recited above (the nonmagnetic layer 11*cq*) is aligned with the second direction (e.g., the X-axis direction). A magnetic layer 11*cn* may be further provided.

As shown in FIG. 8B, the first other-side member 11*b* includes multiple conductive first other-side nonmagnetic layers (the nonmagnetic layers 11*bp*, 11*bq*, and 11*br*, etc.), and a first other-side magnetic layer (a magnetic layer 11*bm*) provided between one of the multiple first other-side nonmagnetic layers (the nonmagnetic layer 11*bp*) and another one of the multiple first other-side nonmagnetic layers (the nonmagnetic layer 11*bq*). The direction from the one of the multiple first other-side nonmagnetic layers recited above (the nonmagnetic layer 11*bp*) toward the other one of the multiple first other-side nonmagnetic layers recited above (the nonmagnetic layer 11*bq*) is aligned with the third direction (e.g., the Y-axis direction). A magnetic layer 11*bn* may be further provided.

Figure 8D:
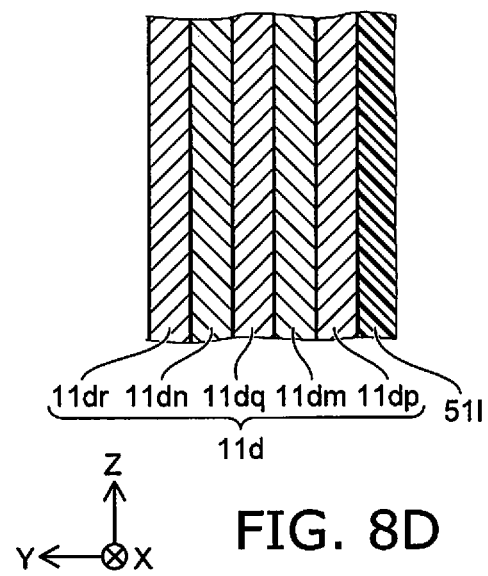

As shown in FIG. 8D, the first opposite other-side member 11*d* includes multiple conductive first opposite other-side nonmagnetic layers (the nonmagnetic layers 11*dp*, 11*dq*, and 11*dr*, etc.), and a first opposite other-side magnetic layer (a magnetic layer 11*dm*) provided between one of the multiple first opposite other-side nonmagnetic layers (the nonmagnetic layer 11*dp*) and another one of the multiple first opposite other-side nonmagnetic layers (the nonmagnetic layer 11*dq*). The direction from the one of the multiple first opposite other-side nonmagnetic layers recited above (the nonmagnetic layer 11*dp*) toward the other one of the multiple first opposite other-side nonmagnetic layers recited above (the nonmagnetic layer 11*dq*) is aligned with the third direction (e.g., the Y-axis direction). A magnetic layer 11*dn* may be further provided. For example, the first side member 11*a*, the first opposite side member 11*c*, the first other-side member 11*b*, and the first opposite other-side member 11*d* recited above may be connected to an electric potential (e.g., the ground potential).

FIG. 9A to FIG. 9D are schematic cross-sectional views illustrating portions of the electronic device according to the first embodiment.

These drawings respectively illustrate the first base material side member 21*a*, the first base material opposite side member 21*c*, the first base material other-side member 21*b*, and the first base material opposite other-side member 21*d*.

Figure 9A:
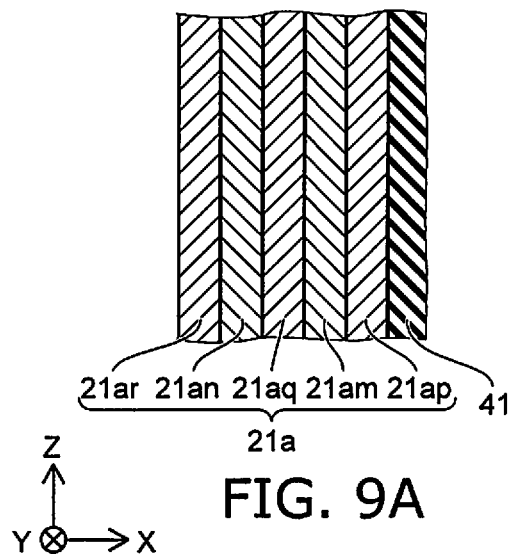
FIG. 9A to FIG. 9D are schematic cross-sectional views illustrating portions of the electronic device according to the first embodiment.

As shown in FIG. 9A, the first base material side member 21*a* includes multiple conductive first base material side nonmagnetic layers (the nonmagnetic layers 21*ap*, 21*aq*, and 21*ar*, etc.), and a first base material side magnetic layer (a magnetic layer 21*am*) provided between one of the multiple first base material side nonmagnetic layers (the nonmagnetic layer 21*ap*) and another one of the multiple first base material side nonmagnetic layers (the nonmagnetic layer 21*aq*). The direction from the one of the multiple first base material side nonmagnetic layers recited above (the nonmagnetic layer 21*ap*) and toward the other one of the multiple first base material side nonmagnetic layers recited above (the nonmagnetic layer 21*aq*) is aligned with the second direction (e.g., the X-axis direction). A magnetic layer 21*an* may be further provided.

Figure 9B:
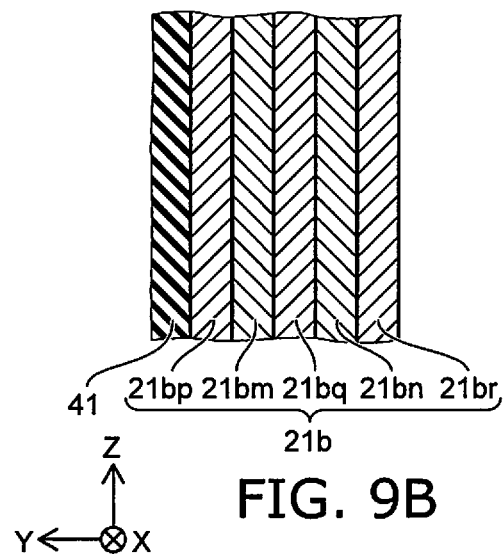
Figure 9C:
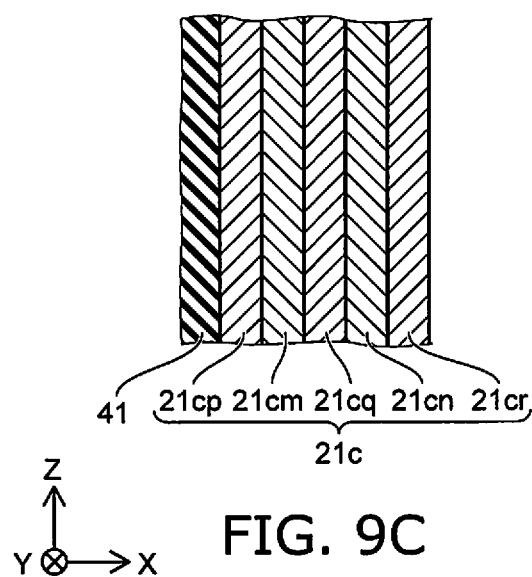

As shown in FIG. 9C, the first base material opposite side member 21*c* includes multiple conductive first base material opposite side nonmagnetic layers (the nonmagnetic layers 21*cp*, 21*cq*, and 21*cr*, etc.), and a first base material opposite side magnetic layer (a magnetic layer 21*cm*) provided between one of the multiple first base material opposite side nonmagnetic layers (the nonmagnetic layer 21*cp*) and another one of the multiple first base material opposite side nonmagnetic layers (the nonmagnetic layer 21*cq*). The direction from the one of the multiple first base material opposite side nonmagnetic layers recited above (the nonmagnetic layer 21*cp*) toward the other one of the multiple first base material opposite side nonmagnetic layers recited above (the nonmagnetic layer 21*cq*) is aligned with the second direction (e.g., the X-axis direction). A magnetic layer 21*cn* may be further provided.

As shown in FIG. 9B, the first base material other-side member 21*b* includes multiple conductive first base material other-side nonmagnetic layers (the nonmagnetic layers 21*bp*, 21*bq*, and 21*br*, etc.), and a first base material other-side magnetic layer (a magnetic layer 21*bm*) provided between one of the multiple first base material other-side nonmagnetic layers (the nonmagnetic layer 21*bp*) and another one of the multiple first base material other-side nonmagnetic layers (the nonmagnetic layer 21*bq*). The direction from the one of the multiple first base material other-side nonmagnetic layers recited above (the nonmagnetic layer 21*bp*) toward the other one of the multiple first base material other-side nonmagnetic layers recited above (the nonmagnetic layer 21*bq*) is aligned with the third direction (e.g., the Y-axis direction). A magnetic layer 21*bn* may be further provided.

Figure 9D:
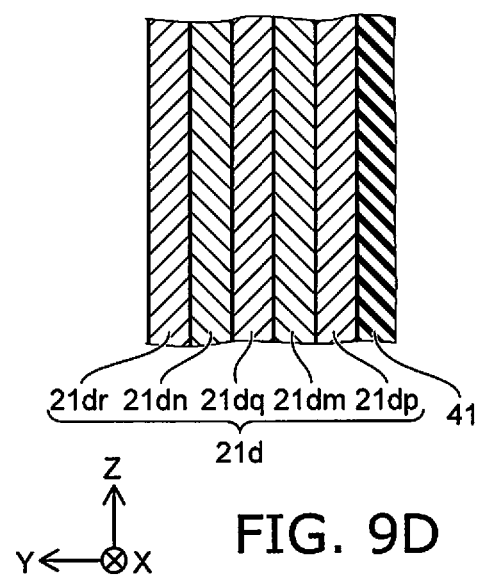

As shown in FIG. 9D, the first base material opposite other-side member 21*d* includes multiple conductive first base material opposite other-side nonmagnetic layers (the nonmagnetic layers 21*dp*, 21*dq*, and 21*dr*, etc.), and a first base material opposite other-side magnetic layer (a magnetic layer 21*dm*) provided between one of the multiple first base material opposite other-side nonmagnetic layers (the nonmagnetic layer 21*dp*) and another one of the multiple first base material opposite other-side nonmagnetic layers (the nonmagnetic layer 21*dq*). The direction from the one of the multiple first base material opposite other-side nonmagnetic layers recited above (the nonmagnetic layer 21*dp*) toward the other one of the multiple first base material opposite other-side nonmagnetic layers recited above (the nonmagnetic layer 21*dq*) is aligned with the third direction (e.g., the Y-axis direction). A magnetic layer 21*dn* may be further provided.

For example, the first base material side member 21*a*, the first base material opposite side member 21*c*, the first base material other-side member 21*b*, and the first base material opposite other-side member 21*d* may be connected to an electric potential (e.g., the ground potential).

FIG. 10A to FIG. 10D are schematic cross-sectional views illustrating portions of the electronic device according to the first embodiment.

These drawings respectively illustrate the second side member 12*a*, the second opposite side member 12*c*, the second other-side member 12*b*, and the second opposite other-side member 12*d*.

Figure 10A:
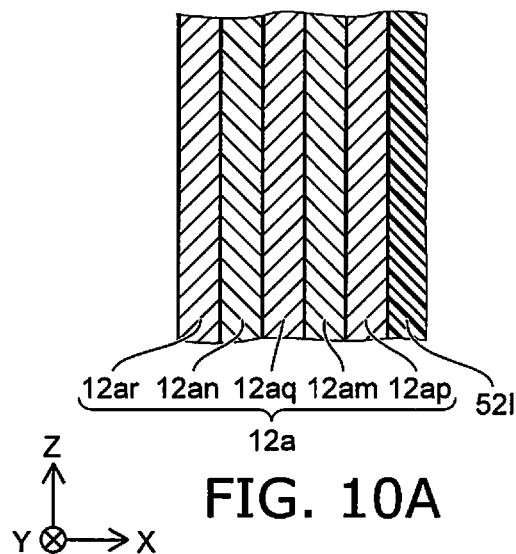
FIG. 10A to FIG. 10D are schematic cross-sectional views illustrating portions of the electronic device according to the first embodiment.

As shown in FIG. 10A, the second side member 12*a* may include nonmagnetic layers 12*ap*, 12*aq*, and 12*ar*, etc. The second side member 12*a* may include a magnetic layer 12*am* (and a magnetic layer 12*an*).

Figure 10B:
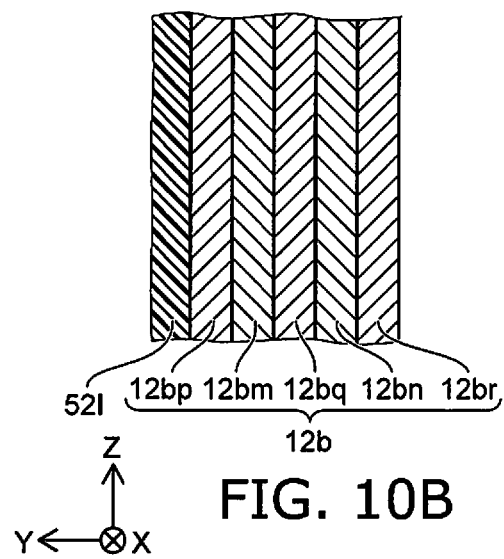
Figure 10C:
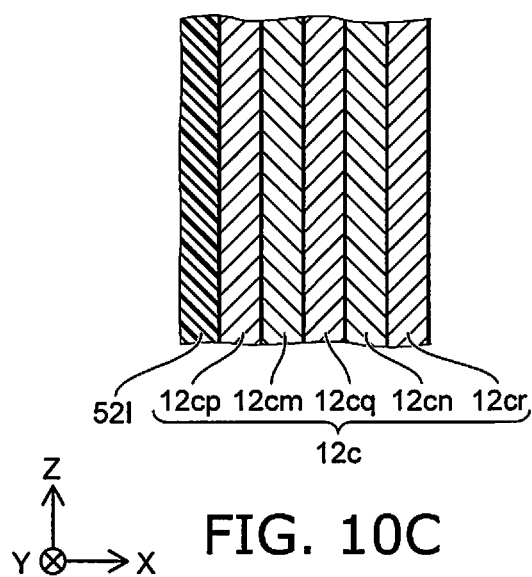

As shown in FIG. 10C, the second opposite side member 12*c* may include nonmagnetic layers 12*cp*, 12*cq*, and 12*cr*, etc. The second opposite side member 12c may include a magnetic layer 12cm (and a magnetic layer 12cn).

As shown in FIG. 10B, the second other-side member 12b may include nonmagnetic layers 12bp, 12bq, and 12br, etc. The second other-side member 12b may include a magnetic layer 12bm (and a magnetic layer 12bn).

Figure 10D:
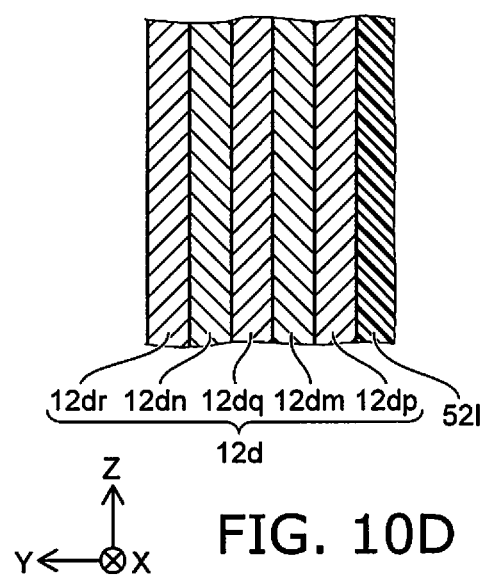

As shown in FIG. 10D, the second opposite other-side member 12d may include nonmagnetic layers 12dp, 12dq, and 12dr, etc. The second opposite other-side member 12d may include a magnetic layer 12dm (and a magnetic layer 12dn).

FIG. 11A to FIG. 11D are schematic cross-sectional views illustrating portions of the electronic device according to the first embodiment.

These drawings respectively illustrate the second base material side member 22a, the second base material opposite side member 22c, the second base material other-side member 22b, and the second base material opposite other-side member 22d.

Figure 11A:
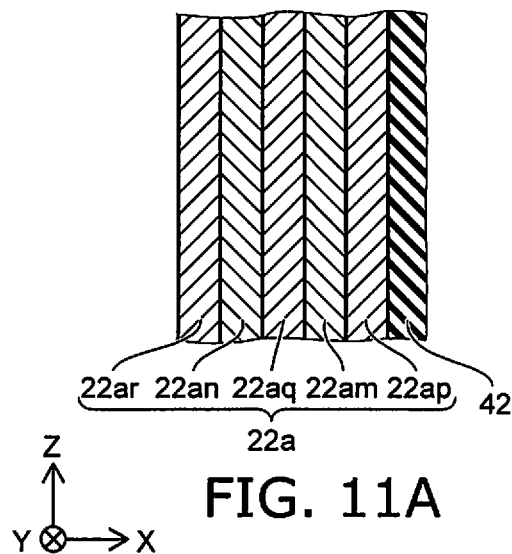
FIG. 11A to FIG. 11D are schematic cross-sectional views illustrating portions of the electronic device according to the first embodiment.

As shown in FIG. 11A, the second base material side member 22a may include nonmagnetic layers 22ap, 22aq, and 22ar, etc. The second base material side member 22a may include a magnetic layer 22am (and a magnetic layer 22an).

Figure 11B:
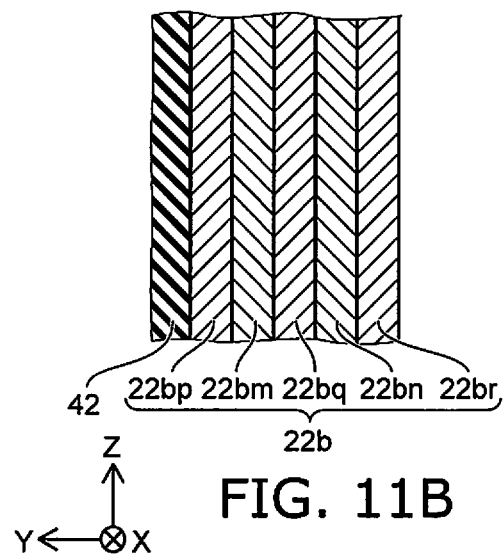
Figure 11C:
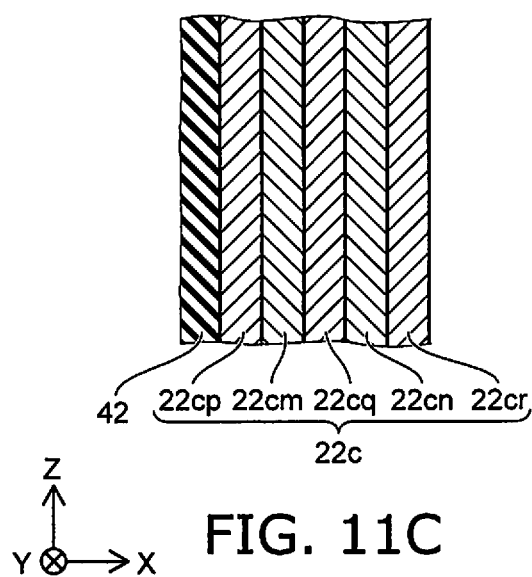

As shown in FIG. 11C, the second base material opposite side member 22c may include nonmagnetic layers 22cp, 22cq, and 22cr, etc. The second base material opposite side member 22c may include a magnetic layer 22cm (and a magnetic layer 22cn).

As shown in FIG. 11B, the second base material other-side member 22b may include nonmagnetic layers 22bp, 22bq, and 22br, etc. The second base material other-side member 22b may include a magnetic layer 22bm (and a magnetic layer 22bn).

Figure 11D:
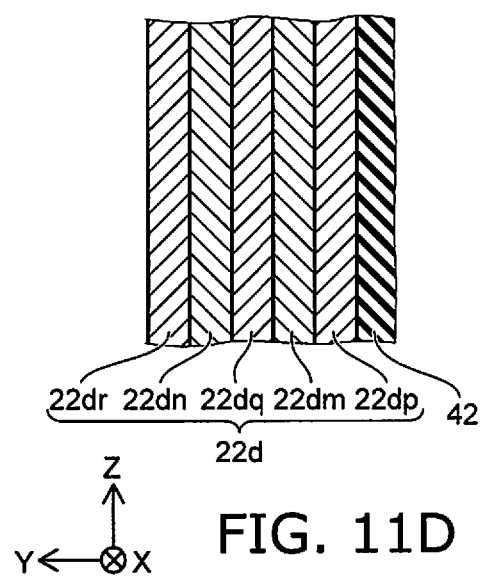

As shown in FIG. 11D, the second base material opposite other-side member 22d may include nonmagnetic layers 22dp, 22dq, and 22dr, etc. The second base material opposite other-side member 22d may include a magnetic layer 22dm (and a magnetic layer 22dn).

FIG. 12A to FIG. 12D are schematic cross-sectional views illustrating portions of the electronic device according to the first embodiment.

These drawings respectively illustrate the third side member 13a, the third opposite side member 13c, the third other-side member 13b, and the third opposite other-side member 13d.

Figure 12A:
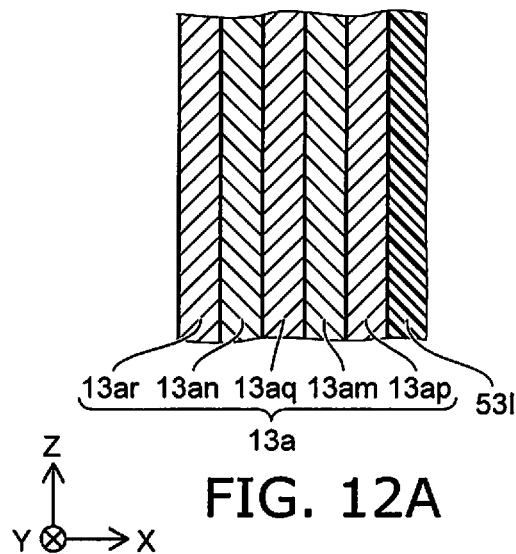
FIG. 12A to FIG. 12D are schematic cross-sectional views illustrating portions of the electronic device according to the first embodiment.

As shown in FIG. 12A, the third side member 13a may include nonmagnetic layers 13ap, 13aq, and 13ar, etc. The third side member 13a may include a magnetic layer 13am (and a magnetic layer 13an).

Figure 12B:
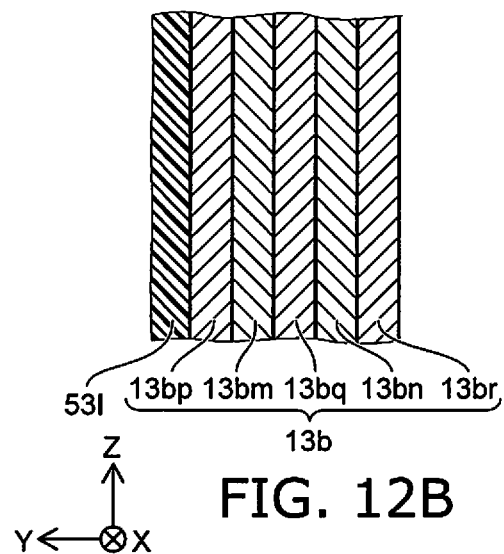
Figure 12C:
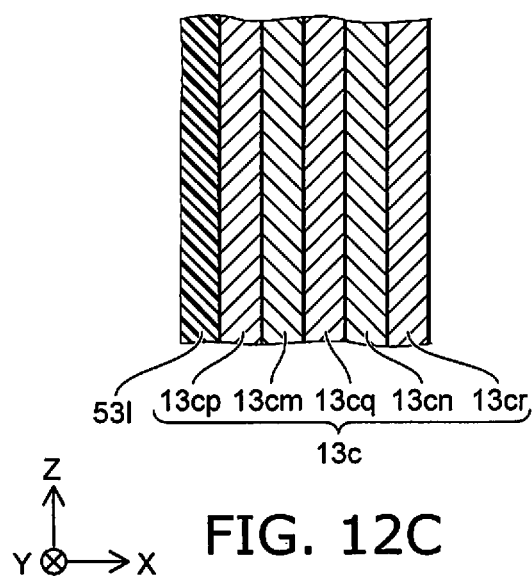

As shown in FIG. 12C, the third opposite side member 13c may include nonmagnetic layers 13cp, 13cq, and 13cr, etc. The third opposite side member 13c may include a magnetic layer 13cm (and a magnetic layer 13cn).

As shown in FIG. 12B, the third other-side member 13b may include nonmagnetic layers 13bp, 13bq, and 13br, etc. The third other-side member 13b may include a magnetic layer 13bm (and a magnetic layer 13bn).

Figure 12D:
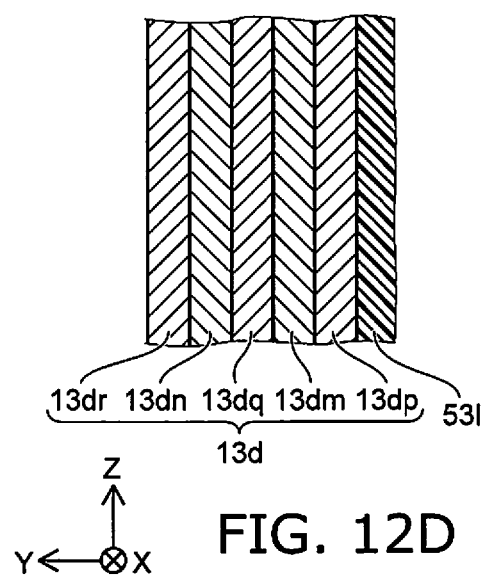

As shown in FIG. 12D, the third opposite other-side member 13d may include nonmagnetic layers 13dp, 13dq, and 13dr, etc. The third opposite other-side member 13d may include a magnetic layer 13dm (and a magnetic layer 13dn).

Several examples of electronic devices according to the embodiment will now be described. An overview of portions different from those of the electronic device 110 will be described.

Figure 13:
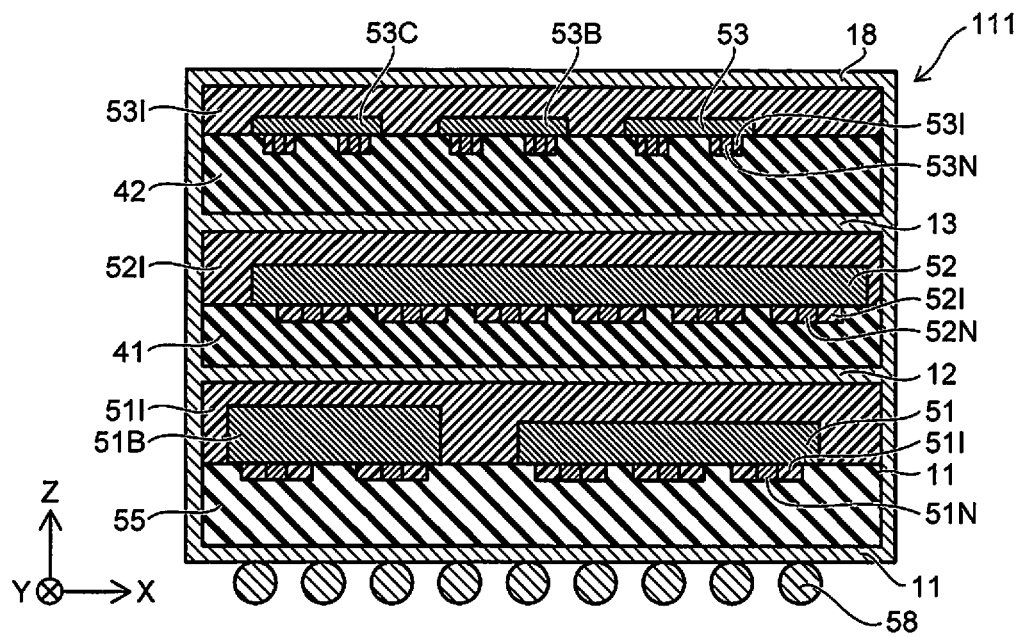
FIG. 13 is a schematic cross-sectional view illustrating an electronic device according to the first embodiment.

FIG. 13 is a schematic cross-sectional view illustrating an electronic device according to the first embodiment.

In the electronic device 111 according to the embodiment as shown in FIG. 13, the base body 55 is provided between the first member 11 and the first element 51. The first base material 41 is provided between the second member 12 and the second element 52. The second base material 42 is provided between the third member 13 and the third element 53.

In the electronic device 111 as well, the electromagnetic waves can be attenuated by the first to third members 11 to 13. An electronic device can be provided in which the operations can be more stable.

Figure 14:
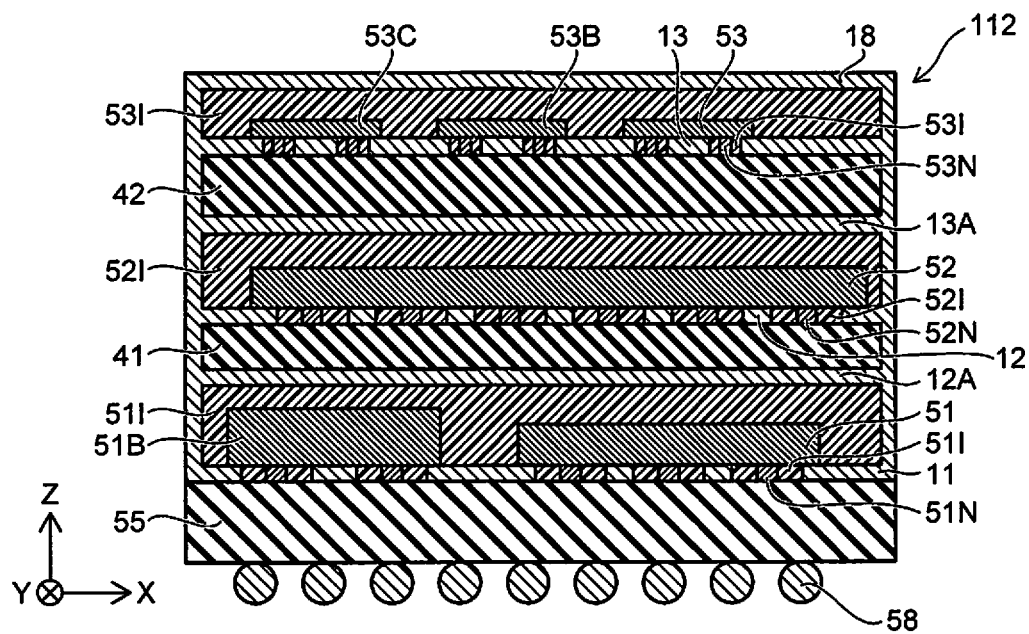
FIG. 14 is a schematic cross-sectional view illustrating an electronic device according to the first embodiment.

FIG. 14 is a schematic cross-sectional view illustrating an electronic device according to the first embodiment.

As shown in FIG. 14, another second member 12A and another third member 13A are further provided in the electronic device 112 according to the embodiment. The other second member 12A is provided between the first element 51 and the second member 12. The first base material 41 is provided between the other second member 12A and the second member 12. The other third member 13A is provided between the second element 52 and the third member 13. The second base material 42 is provided between the other third member 13A and the third member 13.

For example, the other second member 12A may have a configuration similar to that of the second member 12. For example, the other second member 12A includes multiple nonmagnetic layers, and a magnetic layer provided between the multiple nonmagnetic layers. For example, the other third member 13A may have a configuration similar to that of the third member 13. For example, the other third member 13A includes multiple nonmagnetic layers, and a magnetic layer provided between the multiple nonmagnetic layers.

In the electronic device 112 as well, the electromagnetic waves can be attenuated by the first to third members 11 to 13, the second member 12A, and the third member 13A. For example, in the case where a hole is provided in one member, the other members overlap the hole. The electromagnetic waves can be attenuated more effectively. An electronic device can be provided in which the operations can be more stable.

Second Embodiment

FIG. 15A to FIG. 15D are schematic views illustrating an electronic device according to a second embodiment.

Figure 15A:
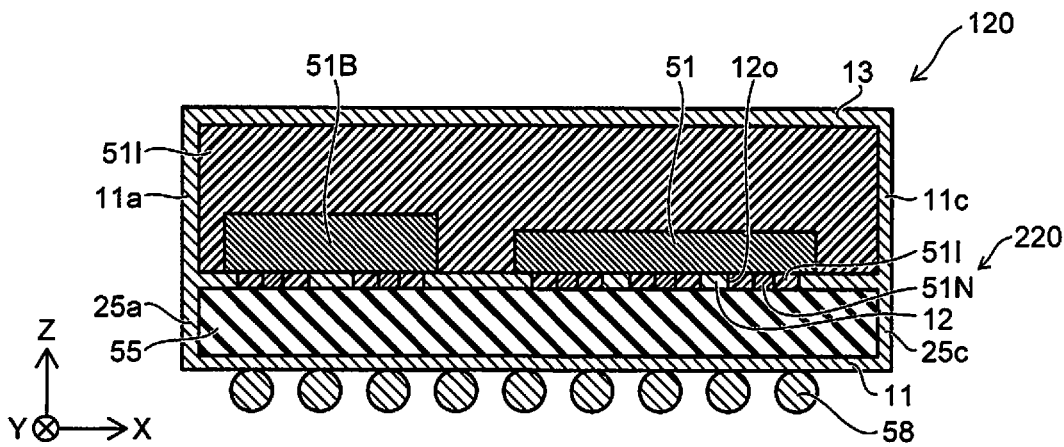
FIG. 15A to FIG. 15D are schematic views illustrating an electronic device according to a second embodiment.
Figure 15B:
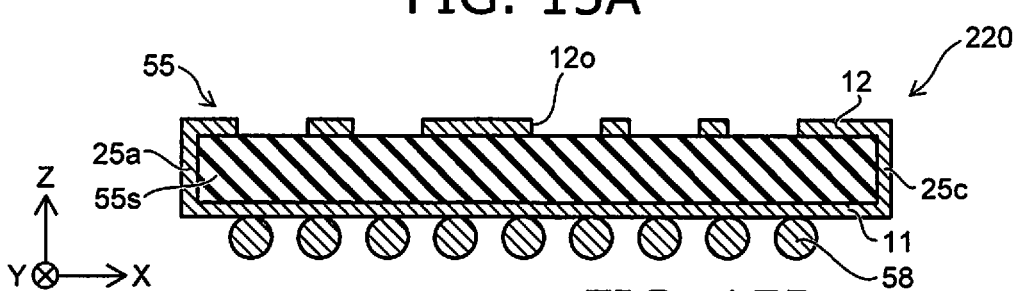
Figure 15C:
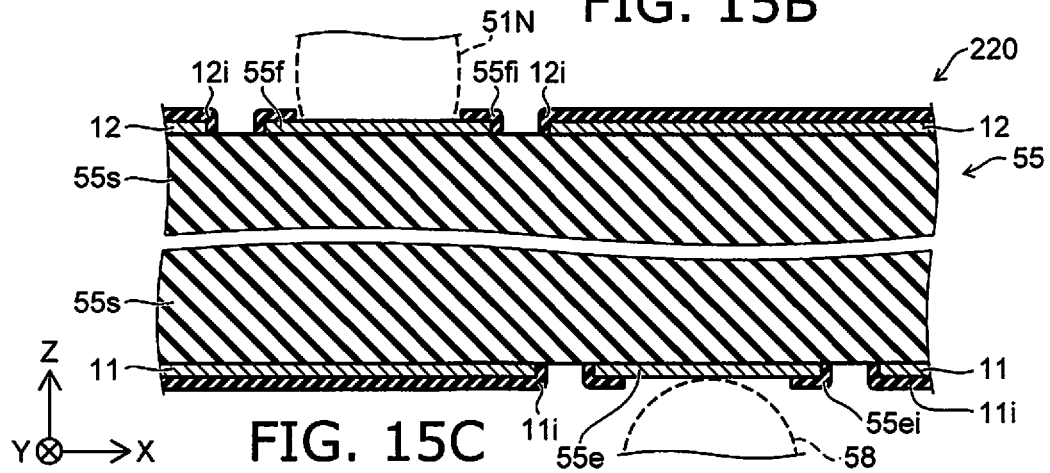
Figure 15D:
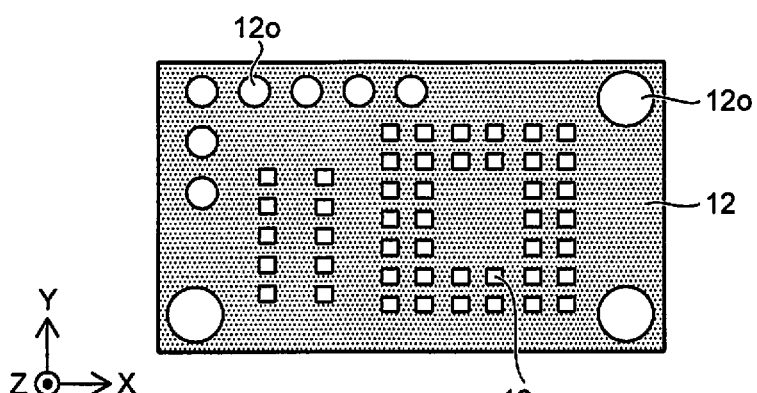

FIG. 15A is a cross-sectional view. FIG. 15B is a cross-sectional view of a mounting member 220 that can be used in the electronic device. FIG. 15C is an enlarged cross-sectional view of the mounting member 220. FIG. 15D is a plan view of the second member 12. The first insulating member 51I, etc., are not illustrated in FIG. 15C.

As shown in FIG. 15A, the electronic device 120 includes the mounting member 220, the first element 51, and the third member 13. The element 51B is further provided in the example. The first element 51 and the element 51B are provided between the mounting member 220 and the third member 13 in the first direction (the Z-axis direction). In the example, the first insulating member 51I is provided between the first element 51 and the third member 13 and between the element 51B and the third member 13.

As shown in FIG. 15B, the mounting member 220 (e.g., the base body 55) includes the substrate 55s, the first member 11, and the second member 12. The substrate 55s is provided between the first member 11 and the second member 12 in the Z-axis direction.

The connection portion 58 (e.g., the solder bumps) is provided in the example. The base body 55 is provided between the connection portion 58 and the second member 12. The first element 51 is mounted to the surface where the second member 12 is provided.

As shown in FIG. 15D, the second member 12 has the hole 12o. As shown in FIG. 15A, the first connection member 51N is provided between the first element 51 and the substrate 55s. The first connection member 51N overlaps the hole 12o in the Z-axis direction. A portion of the first insulating member 51I may be provided between the first element 51 and the substrate 55s.

As shown in FIG. 15C, the mounting member 220 (the base body 55) includes the base body electrode 55e and an element-side electrode 55f. For example, the substrate 55s is provided between the base body electrode 55e and the element-side electrode 55f. The connection portion 58 is provided at the base body electrode 55e. The first connection member 51N is provided at the element-side electrode 55f. The base body 55 and the first element 51 are electrically connected by the first connection member 51N (referring to FIG. 15A). For example, the first connection member 51N electrically connects the connection portion 58 and the first element 51 via an interconnect (including an electrode, etc.) provided in the base body 55. The interconnect is at least one of provided inside the base body 55 (the substrate 55s) or provided at the surface of the base body 55 (the substrate 55s).

In the example, the base body 55 further includes the base body insulating layer 55ei. The base body insulating layer 55ei is between the base body electrode 55e and the first member 11. In the example, the base body 55 further includes an element-side insulating layer 55fi. The element-side insulating layer 55fi is between the element-side electrode 55f and the second member 12.

For example, the first member insulating layer 11l may be further provided. The first member 11 is provided between the first member insulating layer 11i and the substrate 55s. For example, the second member insulating layer 12i may be further provided. The second member 12 is provided between the second member insulating layer 12i and the substrate 55s.

In the mounting member 220 (the base body 55), the first member 11 is provided at one surface of the substrate 55s; and the second member 12 is provided at another surface of the substrate 55s. The electromagnetic waves can be attenuated further. For example, the second member 12 may overlap at least a portion of the hole 11o in the Z-axis direction. For example, the first member 11 may overlap at least a portion of the hole 12o in the Z-axis direction. The electromagnetic waves that pass through the holes can be attenuated more effectively.

Conductive films (a base body side member 25a, a base body opposite side member 25c, etc.) may be provided at the side surfaces of the mounting member 220 (the base body 55) (referring to FIG. 15A and FIG. 15B). Examples of the conductive films provided at the side surfaces of the mounting member 220 (the base body 55) will now be described.

FIG. 16A to FIG. 16E are schematic cross-sectional views illustrating portions of the electronic device according to the second embodiment.

Figure 16A:
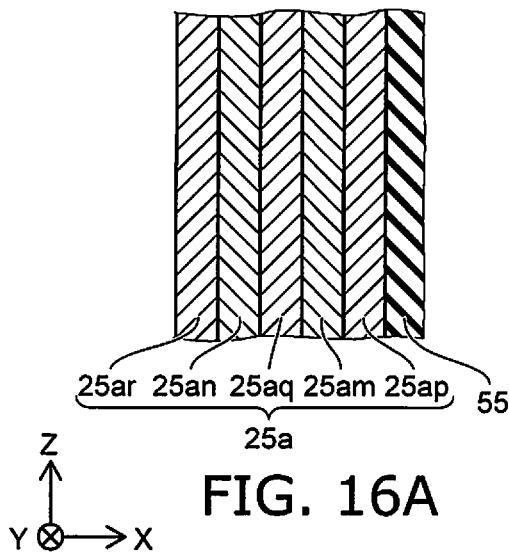
FIG. 16A to FIG. 16E are schematic cross-sectional views illustrating portions of the electronic device according to the second embodiment.
Figure 16B:
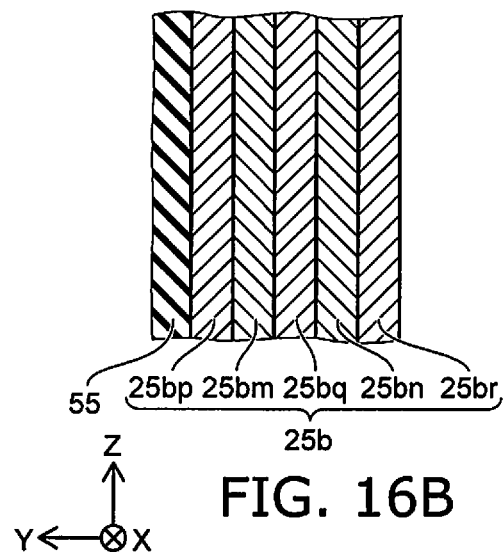
Figure 16C:
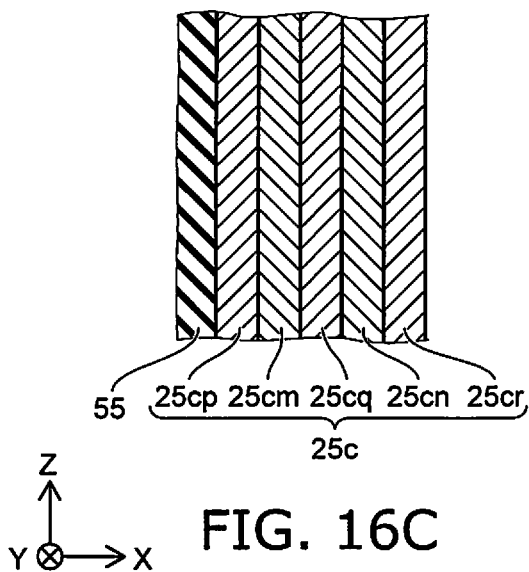
Figure 16D:
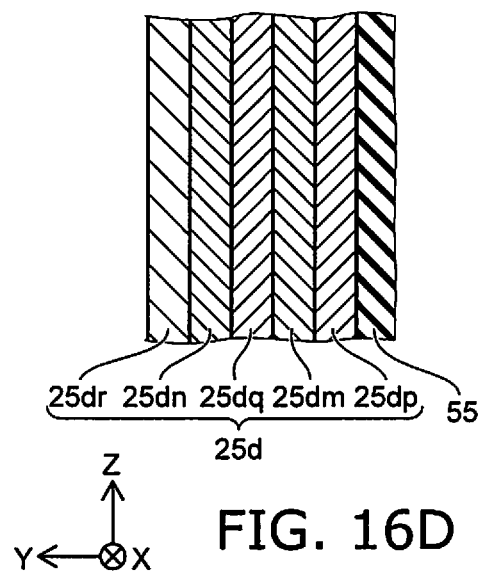
Figure 16E:
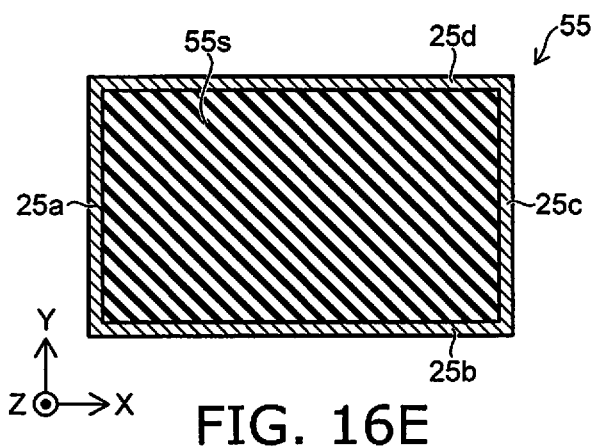

FIG. 16E is a cross-sectional view of the X-Y plane passing through the substrate 55s. FIG. 16A to FIG. 16D are enlarged cross-sectional views.

As shown in FIG. 16E, the mounting member 220 (the base body 55) may further include the base body side member 25a, the base body opposite side member 25c, a base body other-side member 25b, and a base body opposite other-side member 25d. The substrate 55s is between the base body side member 25a and the base body opposite side member 25c in the second direction (in the example, the X-axis direction) crossing the first direction. The substrate 55s is between the base body other-side member 25b and the base body opposite other-side member 25d in the third direction (in the example, the Y-axis direction) crossing a plane including the first direction and the second direction.

As shown in FIG. 16A, the base body side member 25a includes multiple conductive base body side nonmagnetic layers (the nonmagnetic layers 25ap, 25aq, and 25ar, etc.), and a base body side magnetic layer (a magnetic layer 25am) provided between one of the multiple base body side nonmagnetic layers (the nonmagnetic layer 25ap) and another one of the multiple base body side nonmagnetic layers (the nonmagnetic layer 25aq). The direction from the one of the multiple base body side nonmagnetic layers recited above (the nonmagnetic layer 25ap) toward the other one of the multiple base body side nonmagnetic layers recited above (the nonmagnetic layer 25aq) is aligned with the second direction (e.g., the X-axis direction). A magnetic layer 25an may be further provided.

As shown in FIG. 16C, the base body opposite side member 25c includes multiple conductive base body opposite side nonmagnetic layers (the nonmagnetic layers 25cp, 25cq, and 25cr, etc.), and a base body opposite side magnetic layer (a magnetic layer 25cm) provided between one of the multiple base body opposite side nonmagnetic layers (the nonmagnetic layer 25cp) and another one of the multiple base body opposite side nonmagnetic layers (the nonmagnetic layer 25cq). The direction from the one of the multiple base body opposite side nonmagnetic layers recited above (the nonmagnetic layer 25cp) toward the other one of the multiple base body opposite side nonmagnetic layers recited above (the nonmagnetic layer 25cq) is aligned with the second direction (e.g., the X-axis direction). A magnetic layer 25cn may be further provided.

As shown in FIG. 16B, the base body other-side member 25b includes multiple conductive base body other-side nonmagnetic layers (the nonmagnetic layers 25bp, 25bq, and 25br, etc.), and a base body other-side magnetic layer (a magnetic layer 25bm) provided between one of the multiple base body other-side nonmagnetic layers (the nonmagnetic layer 25bp) and another one of the multiple base body other-side nonmagnetic layers (the nonmagnetic layer 25bq). The direction from the one of the multiple base body other-side nonmagnetic layers recited above (the nonmagnetic layer 25bp) toward the other one of the multiple base body other-side nonmagnetic layers recited above (the nonmagnetic layer 25bq) is aligned with the third direction (e.g., the Y-axis direction). A magnetic layer 25bn may be further provided.

As shown in FIG. 16D, the base body opposite other-side member 25d includes multiple conductive base body opposite other-side nonmagnetic layers (the nonmagnetic layers 25dp, 25dq, and 25dr, etc.), and a base body opposite other-side magnetic layer (a magnetic layer 25dm) provided between one of the multiple base body opposite other-side nonmagnetic layers (the nonmagnetic layer 25dp) and another one of the multiple base body opposite other-side nonmagnetic layers (the nonmagnetic layer 25dq). The direction from the one of the multiple base body opposite other-side nonmagnetic layers recited above (the nonmagnetic layer 25dp) toward the other one of the multiple base body opposite other-side nonmagnetic layers recited above (the nonmagnetic layer 25dq) is aligned with the third direction (e.g., the Y-axis direction). A magnetic layer 25dn may be further provided.

For example, the base body side member 25a, the base body opposite side member 25c, the base body other-side member 25b, and the base body opposite other-side member 25d recited above may be set to one potential (e.g., the ground potential). Electromagnetic waves that travel in directions having components along the X-Y plane can be attenuated effectively by these side members.

Third Embodiment

Figure 17:
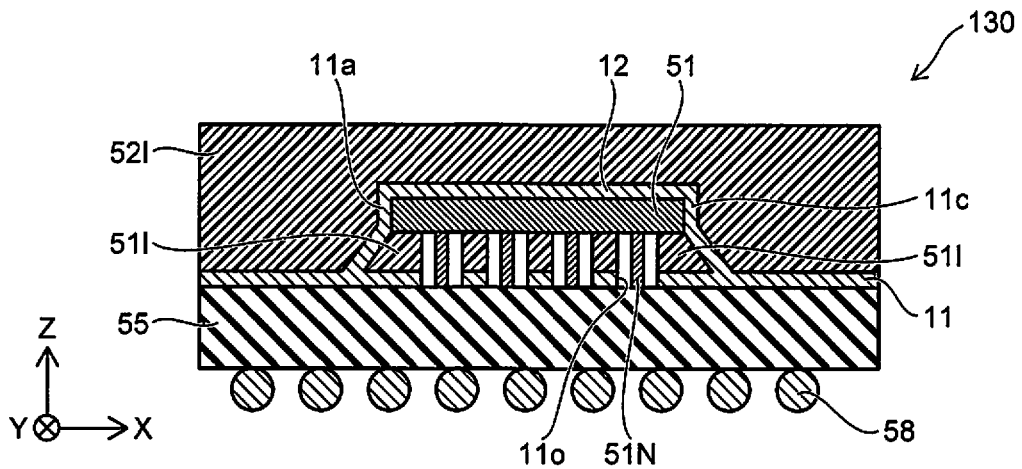
FIG. 17 is a schematic cross-sectional view illustrating an electronic device according to a third embodiment.

FIG. 17 is a schematic cross-sectional view illustrating an electronic device according to a third embodiment.

As shown in FIG. 17, the electronic device 130 according to the embodiment includes the first member 11, the second member 12, the first element 51, and the first insulating member 51I.

The direction from the first member 11 toward the second member 12 is aligned with the first direction (the Z-axis direction). The first element 51 is between the first member 11 and the second member 12 in the first direction. The first insulating member 51I is between the first member 11 and the first element 51 in the first direction.

For example, the first member 11 and the second member 12 may have the configurations described in reference to the first embodiment. For example, the first member 11 and the second member 12 may have the configurations described in reference to FIG. 2A and FIG. 2B.

For example, as shown in FIG. 2A, the first member 11 includes multiple conductive first nonmagnetic layers (the nonmagnetic layers 11p, 11q, and 11r, etc.), and a first magnetic layer (the magnetic layer 11m) provided between one of the multiple first nonmagnetic layers (the nonmagnetic layer 11p) and another one of the multiple first nonmagnetic layers (the nonmagnetic layer 11q). The direction from the one of the multiple first nonmagnetic layers recited above (the nonmagnetic layer 11p) toward the other one of the multiple first nonmagnetic layers recited above (the nonmagnetic layer 11q) is aligned with the first direction. The magnetic layer 11n may be provided.

For example, as shown in FIG. 2B, the second member 12 includes multiple conductive second nonmagnetic layers (the nonmagnetic layers 12p, 12q, and 12r, etc.), and a second magnetic layer (the magnetic layer 12m) provided between one of the multiple second nonmagnetic layers (the nonmagnetic layer 12p) and another one of the multiple second nonmagnetic layers (the nonmagnetic layer 12q). The direction from the one of the multiple second nonmagnetic layers recited above (the nonmagnetic layer 12p) toward the other one of the multiple second nonmagnetic layers recited above (the nonmagnetic layer 12q) is aligned with the first direction. The magnetic layer 12n may be provided.

For example, the first member 11 and the second member 12 may have the configurations described in reference to FIG. 6C and FIG. 6B.

In the electronic device 130, electrical shorts between the first member 11 and the first element 51 are suppressed by providing the first insulating member 51I.

As shown in FIG. 17, the electronic device 130 may further include the first side member 11a and the first opposite side member 11c. The first side member 11a and the first opposite side member 11c may have the configurations described in reference to the first embodiment.

As shown in FIG. 17, the first element 51 is between the first side member 11a and the first opposite side member 11c in the second direction (in the example, the X-axis direction) crossing the first direction (the Z-axis direction).

For example, as shown in FIG. 8A, the first side member 11a includes multiple conductive first side nonmagnetic layers (the nonmagnetic layers 11ap, 11aq, and liar, etc.), and a first side magnetic layer (the magnetic layer 11am) provided between one of the multiple first side nonmagnetic layers (the nonmagnetic layer 11ap) and another one of the multiple first side nonmagnetic layers (the nonmagnetic layer 11aq). The direction from the one of the multiple first side nonmagnetic layers recited above (the nonmagnetic layer 11ap) toward the other one of the multiple first side nonmagnetic layers recited above (the nonmagnetic layer 11aq) is aligned with the second direction (e.g., the X-axis direction). The magnetic layer 11an may be provided.

For example, as shown in FIG. 8C, the first opposite side member 11c includes multiple conductive first opposite side nonmagnetic layers (the nonmagnetic layers 11cp, 11cq, and 11cr, etc.), and a first opposite side magnetic layer (the magnetic layer 11cm) provided between one of the multiple first opposite side nonmagnetic layers (the nonmagnetic layer 11cp) and another one of the multiple first opposite side nonmagnetic layers (the nonmagnetic layer 11cq). The direction from the one of the multiple first opposite side nonmagnetic layers recited above (the nonmagnetic layer 11cp) toward the other one of the multiple first opposite side nonmagnetic layers recited above (the nonmagnetic layer 11cq) is aligned with the second direction (in the example, the X-axis direction). The magnetic layer 11cn may be provided.

The electronic device 130 may further include the first other-side member 11b and the first opposite other-side member 11d (referring to FIG. 7A).

The first element 51 is between the first other-side member 11b and the first opposite other-side member 11d in the third direction (in the example, the Y-axis direction) crossing a plane including the first direction and the second direction.

For example, as shown in FIG. 8B, the first other-side member 11b includes multiple conductive first other-side nonmagnetic layers (the nonmagnetic layers 11bp, 11bq, and 11br, etc.), and a first other-side magnetic layer (the magnetic layer 11bm) provided between one of the multiple first other-side nonmagnetic layers (the nonmagnetic layer 11bp) and another one of the multiple first other-side nonmagnetic layers (the nonmagnetic layer 11bq). The direction from the one of the multiple first other-side nonmagnetic layers recited above (the nonmagnetic layer 11bp) toward the other one of the multiple first other-side nonmagnetic layers recited above (the nonmagnetic layer 11bq) is aligned with the third direction (in the example, the Y-axis direction). The magnetic layer 11bn may be provided.

For example, as shown in FIG. 8D, the first opposite other-side member 11d includes multiple conductive first opposite other-side nonmagnetic layers (the nonmagnetic layers 11dp, 11dq, and 11dr, etc.), and a first opposite other-side magnetic layer (the magnetic layer 11dm) provided between one of the multiple first opposite other-side nonmagnetic layers (the nonmagnetic layer 11dp) and another one of the multiple first opposite other-side nonmagnetic layers (the nonmagnetic layer 11dq). The direction from the one of the multiple first opposite other-side nonmagnetic layers recited above (the nonmagnetic layer 11dp) toward the other one of the multiple first opposite other-side nonmagnetic layers recited above (the nonmagnetic layer 11*dq*) is aligned with the third direction (in the example, the Y-axis direction). The magnetic layer 11*dn* may be provided.

The electromagnetic waves that travel in directions having X-axis direction components can be attenuated effectively by providing the first side member 11*a* and the first opposite side member 11*c*. The electromagnetic waves that travel in directions having Y-axis direction components can be attenuated effectively by providing the first other-side member 11*b* and the first opposite other-side member 11*d*.

As shown in FIG. 17, the electronic device 130 may further include the second insulating member 52I. The first insulating member 51I is between the first member 11 and the second insulating member 52I in the first direction (the Z-axis direction). The first element 51 is between the first insulating member 51I and the second insulating member 52I in the first direction. The second member 12 is between the first element 51 and the second insulating member 52I in the first direction.

For example, the first side member 11*a* is between the first element 51 and a portion of the second insulating member 52I in the second direction (e.g., the X-axis direction). The first opposite side member 11*c* is between the first element 51 and another portion of the second insulating member 52I in the second direction (e.g., the X-axis direction). The first element 51, the second member 12, the first side member 11*a*, and the first opposite side member 11*c* are protected by the second insulating member 52I. For example, stable operations are obtained easily.

Fourth Embodiment

Figure 18:
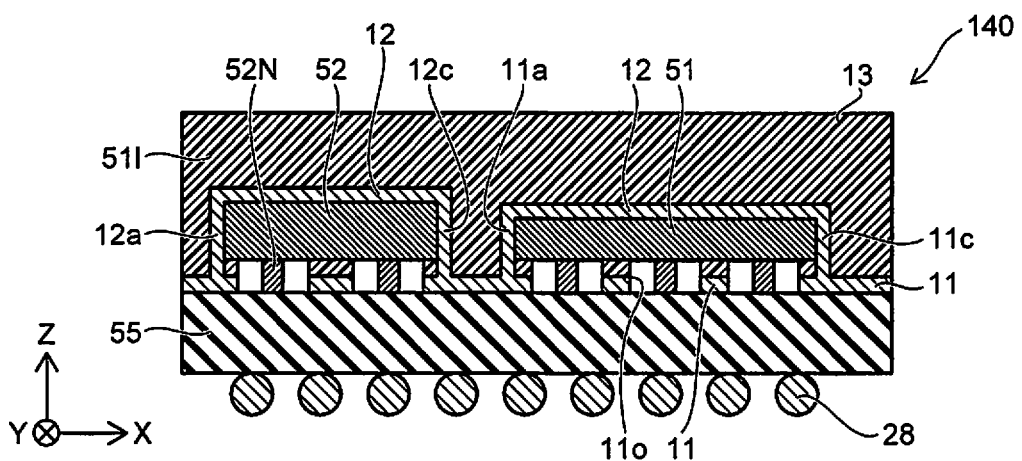
FIG. 18 is a schematic cross-sectional view illustrating an electronic device according to a fourth embodiment.

FIG. 18 is a schematic cross-sectional view illustrating an electronic device according to a fourth embodiment.

As shown in FIG. 18, the electronic device 140 according to the embodiment includes the first member 11, the second member 12, the first element 51, and the second element 52.

The direction from the first member 11 toward the second member 12 is aligned with the first direction (the Z-axis direction). The direction from the second element 52 toward the first element 51 crosses the first direction. The first element 51 is between a portion of the first member 11 and a portion of the second member 12 in the first direction. The second element 52 is between another portion of the first member 11 and another portion of the second member 12 in the first direction.

For example, the first member 11 and the second member 12 have the configurations described in reference to the first embodiment.

For example, as described in reference to FIG. 2A, the first member 11 includes multiple conductive first nonmagnetic layers (the nonmagnetic layers 11*p*, 11*q*, and 11*r*), and a first magnetic layer (the magnetic layer 11*m*) provided between one of the multiple first nonmagnetic layers (the nonmagnetic layer 11*p*) and another one of the multiple first nonmagnetic layers (the nonmagnetic layer 11*q*). The direction from the one of the multiple first nonmagnetic layers recited above (the nonmagnetic layer 11*p*) toward the other one of the multiple first nonmagnetic layers recited above (the nonmagnetic layer 11*q*) is aligned with the first direction (the Z-axis direction). The magnetic layer 11*n* may be provided.

For example, as described in reference to FIG. 2B, the second member 12 includes multiple conductive second nonmagnetic layers (the nonmagnetic layers 12*p*, 12*q*, and 12*r*), and a second magnetic layer (the magnetic layer 12*m*) provided between one of the multiple second nonmagnetic layers (the nonmagnetic layer 12*p*) and another one of the multiple second nonmagnetic layers (the nonmagnetic layer 12*q*). The direction from the one of the multiple second nonmagnetic layers recited above (the nonmagnetic layer 12*p*) toward the other one of the multiple second nonmagnetic layers recited above (the nonmagnetic layer 12*q*) is aligned with the first direction (the Z-axis direction). The magnetic layer 12*n* may be provided.

The electronic device 140 may further include the first side member 11*a*, the first opposite side member 11*c*, the first other-side member 11*b*, and the first opposite other-side member 11*d*. The first element 51 is provided between the first side member 11*a*, the first opposite side member 11*c*, the first other-side member 11*b*, and the first opposite other-side member 11*d*. For example, the first side member 11*a*, the first opposite side member 11*c*, the first other-side member 11*b*, and the first opposite other-side member 11*d* have the configurations described in reference to FIG. 8A to FIG. 8D.

The electronic device 140 may further include the second side member 12*a*, the second opposite side member 12*c*, the second other-side member 12*b*, and the second opposite other-side member 12*d*. The second element 52 is provided between the second side member 12*a*, the second opposite side member 12*c*, the second other-side member 12*b*, and the second opposite other-side member 12*d*. For example, the second side member 12*a*, the second opposite side member 12*c*, the second other-side member 12*b*, and the second opposite other-side member 12*d* have the configurations described in reference to FIG. 10A to FIG. 10D.

Fifth Embodiment

Figure 19:
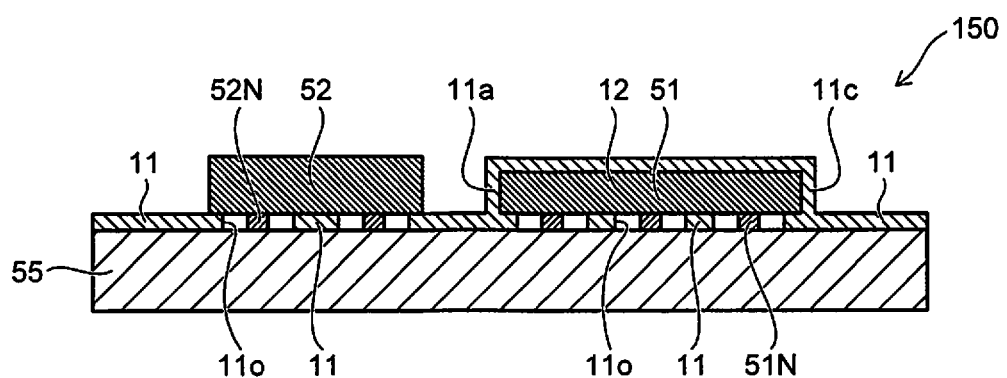
FIG. 19 is a schematic cross-sectional view illustrating an electronic device according to a fifth embodiment.

FIG. 19 is a schematic cross-sectional view illustrating an electronic device according to a fifth embodiment.

As shown in FIG. 19, the electronic device 150 according to the embodiment includes the first member 11, the second member 12, the first element 51, and the second element 52.

The direction from the first member 11 toward the second member 12 is aligned with the first direction (the Z-axis direction). The direction from the second element 52 toward the first element 51 crosses the first direction. The first element 51 is between a portion of the first member 11 and a portion of the second member 12 in the first direction. For example, the first member 11 and the second member 12 have the configurations described in reference to the first embodiment.

The second element 52 includes, for example, an antenna. For example, the second element 52 includes a receiver. The second element 52 is not provided between the first member 11 and the second member 12. Thereby, the reception of the electromagnetic waves is performed by the second element 52.

The first element 51 is provided between the first member 11 and the second member 12. For example, the electromagnetic waves that travel toward the first element 51 are attenuated more effectively by the first member 11 and the second member 12. The electromagnetic waves that are generated by the first element 51 are attenuated more effectively by the first member 11 and the second member 12.

The electronic device 150 may further include the first side member 11*a*, the first opposite side member 11*c*, the first other-side member 11*b*, and the first opposite other-side member 11*d*. The first element 51 is provided between the first side member 11*a*, the first opposite side member 11*c*, the first other-side member 11*b*, and the first opposite other-side member 11d. For example, the first side member 11a, the first opposite side member 11c, the first other-side member 11b, and the first opposite other-side member 11d have the configurations described in reference to FIG. 8A to FIG. 8D.

The embodiments may include, for example, the following configurations (e.g., technological proposals).

Configuration 1

An electronic device, comprising:
first to third members;
a first element; and
a second element,
a direction from the first member toward the third member being aligned with a first direction,
the second member being between the first member and the third member in the first direction,
the first element being between the first member and the second member in the first direction,
the second element being between the second member and the third member in the first direction,
the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction,
the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction,
the third member including a plurality of third nonmagnetic layers and a third magnetic layer, the plurality of third nonmagnetic layers being conductive, the third magnetic layer being provided between one of the plurality of third nonmagnetic layers and an other one of the plurality of third nonmagnetic layers, a direction from the one of the plurality of third nonmagnetic layers toward the other one of the plurality of third nonmagnetic layers being aligned with the first direction.

Configuration 2

The electronic device according to Configuration 1, further comprising a connection member electrically connected to the second element,
the second member having a hole,
the connection member overlapping the hole in the first direction.

Configuration 3

The electronic device according to Configuration 1 or 2, further comprising a first base material,
the first base material being between the first element and the second member in the first direction,
the second member contacting the first base material.

Configuration 4

The electronic device according to Configuration 3, further comprising a connection member,
the second member having a hole,
the first base material including a first base material electrode,
the connection member electrically connecting the first base material electrode and the second element via the hole.

Configuration 5

The electronic device according to Configuration 4, wherein
the first base material further includes a first base material insulating layer, and
the first base material insulating layer is between the second member and the second element and between the first base material electrode and the second member.

Configuration 6

The electronic device according to Configuration 4 or 5, wherein
a thickness of the first base material electrode is substantially the same as a thickness of the one of the plurality of second nonmagnetic layers, and
a material of the first base material electrode is substantially the same as a material of the one of the plurality of second nonmagnetic layers.

Configuration 7

The electronic device according to Configuration 4 or 5, wherein an absolute value of a difference between a thickness of the first base material electrode and a thickness of the one of the plurality of second nonmagnetic layers is not more than ½ of an absolute value of a difference between the thickness of the one of the plurality of second nonmagnetic layers and a thickness of the other one of the plurality of second nonmagnetic layers.

Configuration 8

The electronic device according to any one of Configurations 3 to 7, further comprising a first base material side member, a first base material opposite side member, a first base material other-side member, and a first base material opposite other-side member,
the first base material being between the first base material side member and the first base material opposite side member in a second direction crossing the first direction,
the first base material being between the first base material other-side member and the first base material opposite other-side member in a third direction crossing a plane including the first direction and the second direction,
the first base material side member including a plurality of first base material side nonmagnetic layers and a first base material side magnetic layer, the plurality of first base material side nonmagnetic layers being conductive, the first base material side magnetic layer being provided between one of the plurality of first base material side nonmagnetic layers and an other one of the plurality of first base material side nonmagnetic layers, a direction from the one of the plurality of first base material side nonmagnetic layers toward the other one of the plurality of first base material side nonmagnetic layers being aligned with the second direction, the first base material opposite side member including a plurality of first base material opposite side nonmagnetic layers and a first base material opposite side magnetic layer, the plurality of first base material opposite side nonmagnetic layers being conductive, the first base material opposite side magnetic layer being provided between one of the plurality of first base material opposite side nonmagnetic layers and an other one of the plurality of first base material opposite side nonmagnetic layers, a direction from the one of the plurality of first base material opposite side nonmagnetic layers toward the other one of the plurality of first base material opposite side nonmagnetic layers being aligned with the second direction, the first base material other-side member including a plurality of first base material other-side nonmagnetic layers and a first base material other-side magnetic layer, the plurality of first base material other-side nonmagnetic layers being conductive, the first base material other-side magnetic layer being provided between one of the plurality of first base material other-side nonmagnetic layers and an other one of the plurality of first base material other-side nonmagnetic layers, a direction from the one of the plurality of first base material other-side nonmagnetic layers toward the other one of the plurality of first base material other-side nonmagnetic layers being aligned with the third direction, the first base material opposite other-side member including a plurality of first base material opposite other-side nonmagnetic layers and a first base material opposite other-side magnetic layer, the plurality of first base material opposite other-side nonmagnetic layers being conductive, the first base material opposite other-side magnetic layer being provided between one of the plurality of first base material opposite other-side nonmagnetic layers and an other one of the plurality of first base material opposite other-side nonmagnetic layers, a direction from the one of the plurality of first base material opposite other-side nonmagnetic layers toward the other one of the plurality of first base material opposite other-side nonmagnetic layers being aligned with the third direction.

Configuration 9

The electronic device according to any one of Configurations 1 to 8, further comprising an insulating member including a portion provided between the second element and the second member.

Configuration 10

The electronic device according to Configuration 9, wherein the second element is between the second member and an other portion of the insulating member in the first direction.

Configuration 11

The electronic device according to any one of Configurations 1 to 10, further comprising a first side member, a first opposite side member, a first other-side member, and a first opposite other-side member, the first element being between the first side member and the first opposite side member in a second direction crossing the first direction, the first element being between the first other-side member and the first opposite other-side member in a third direction crossing a plane including the first direction and the second direction, the first side member including a plurality of first side nonmagnetic layers and a first side magnetic layer, the plurality of first side nonmagnetic layers being conductive, the first side magnetic layer being provided between one of the plurality of first side nonmagnetic layers and an other one of the plurality of first side nonmagnetic layers, a direction from the one of the plurality of first side nonmagnetic layers toward the other one of the plurality of first side nonmagnetic layers being aligned with the second direction, the first opposite side member including a plurality of first opposite side nonmagnetic layers and a first opposite side magnetic layer, the plurality of first opposite side nonmagnetic layers being conductive, the first opposite side magnetic layer being provided between one of the plurality of first opposite side nonmagnetic layers and an other one of the plurality of first opposite side nonmagnetic layers, a direction from the one of the plurality of first opposite side nonmagnetic layers toward the other one of the plurality of first opposite side nonmagnetic layers being aligned with the second direction, the first other-side member including a plurality of first other-side nonmagnetic layers and a first other-side magnetic layer, the plurality of first other-side nonmagnetic layers being conductive, the first other-side magnetic layer being provided between one of the plurality of first other-side nonmagnetic layers and an other one of the plurality of first other-side nonmagnetic layers, a direction from the one of the plurality of first other-side nonmagnetic layers toward the other one of the plurality of first other-side nonmagnetic layers being aligned with the third direction, the first opposite other-side member including a plurality of first opposite other-side nonmagnetic layers and a first opposite other-side magnetic layer, the plurality of first opposite other-side nonmagnetic layers being conductive, the first opposite other-side magnetic layer being provided between one of the plurality of first opposite other-side nonmagnetic layers and an other one of the plurality of first opposite other-side nonmagnetic layers, a direction from the one of the plurality of first opposite other-side nonmagnetic layers toward the other one of the plurality of first opposite other-side nonmagnetic layers being aligned with the third direction.

Configuration 12

The electronic device according to any one of Configurations 1 to 9, further comprising a third element,
the third member being between the second element and the third element in the first direction.

Configuration 13

An electronic device, comprising:
a first member;
a second member;
a first element; and
a first insulating member,
a direction from the first member toward the second member being aligned with a first direction,
the first element being between the first member and the second member in the first direction,
the first insulating member being between the first member and the first element in the first direction, the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction, the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction.

Configuration 14

The electronic device according to Configuration 13, further comprising a first side member and a first opposite side member, the first element being between the first side member and the first opposite side member in a second direction crossing the first direction, the first side member including a plurality of first side nonmagnetic layers and a first side magnetic layer, the plurality of first side nonmagnetic layers being conductive, the first side magnetic layer being provided between one of the plurality of first side nonmagnetic layers and an other one of the plurality of first side nonmagnetic layers, a direction from the one of the plurality of first side nonmagnetic layers toward the other one of the plurality of first side nonmagnetic layers being aligned with the second direction, the first opposite side member including a plurality of first opposite side nonmagnetic layers and a first opposite side magnetic layer, the plurality of first opposite side nonmagnetic layers being conductive, the first opposite side magnetic layer being provided between one of the plurality of first opposite side nonmagnetic layers and an other one of the plurality of first opposite side nonmagnetic layers, a direction from the one of the plurality of first opposite side nonmagnetic layers toward the other one of the plurality of first opposite side nonmagnetic layers being aligned with the second direction.

Configuration 15

The electronic device according to Configuration 13, further comprising a first other-side member and a first opposite other-side member, the first element being between the first other-side member and the first opposite other-side member in a third direction crossing a plane including the first direction and the second direction, the first other-side member including a plurality of first other-side nonmagnetic layers and a first other-side magnetic layer, the plurality of first other-side nonmagnetic layers being conductive, the first other-side magnetic layer being provided between one of the plurality of first other-side nonmagnetic layers and an other one of the plurality of first other-side nonmagnetic layers, a direction from the one of the plurality of first other-side nonmagnetic layers toward the other one of the plurality of first other-side nonmagnetic layers being aligned with the third direction, the first opposite other-side member including a plurality of first opposite other-side nonmagnetic layers and a first opposite other-side magnetic layer, the plurality of first opposite other-side nonmagnetic layers being conductive, the first opposite other-side magnetic layer being provided between one of the plurality of first opposite other-side nonmagnetic layers and an other one of the plurality of first opposite other-side nonmagnetic layers, a direction from the one of the plurality of first opposite other-side nonmagnetic layers toward the other one of the plurality of first opposite other-side nonmagnetic layers being aligned with the third direction.

Configuration 16

The electronic device according to Configuration 14 or 15, further comprising a second insulating member, the first insulating member being between the first member and the second insulating member in the first direction, the first element being between the first insulating member and the second insulating member in the first direction, the second member being between the first element and the second insulating member in the first direction.

Configuration 17

The electronic device according to Configuration 16, wherein the first side member is between the first element and a portion of the second insulating member in the second direction, and the first opposite side member is between the first element and an other portion of the second insulating member in the second direction.

Configuration 18

An electronic device, comprising:
a first member;
a second member;
a first element; and
a second element, a direction from the first member toward the second member being aligned with a first direction, a direction from the second element toward the first element crossing the first direction, the first element being between a portion of the first member and a portion of the second member in the first direction, the second element being between an other portion of the first member and an other portion of the second member in the first direction, the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction, the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction.

Configuration 19

The electronic device according to any one of Configurations 1 to 18, wherein
at least a portion of the first magnetic layer includes $Fe_{100-x1-x2}\alpha_{x1}N_{x2}$,
α includes at least one selected from the group consisting of Zr, Hf, Ta, Nb, Ti, Si, and Al,
x1 is not less than 0.5 and not more than 10, and
x2 is not less than 0.5 and not more than 8.

Configuration 20

The electronic device according to any one of Configurations 1 to 18, wherein
the first member further includes an other first magnetic layer,
the other one of the plurality of first nonmagnetic layers is between the first magnetic layer and the other first magnetic layer in the first direction, and
an orientation of a magnetization of the first magnetic layer crosses an orientation of a magnetization of the other first magnetic layer.

According to the embodiments, an electronic device can be provided in which the operations can be more stable.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic devices such as elements, members, basic materials, basic bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic devices practicable by an appropriate design modification by one skilled in the art based on the electronic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic device, comprising:
first to third members;
a first element; and
a second element,
a direction from the first member toward the third member being aligned with a first direction,
the second member being between the first member and the third member in the first direction,
the first element being between the first member and the second member in the first direction,
the second element being between the second member and the third member in the first direction,
the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction,
the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction,
the third member including a plurality of third nonmagnetic layers and a third magnetic layer, the plurality of third nonmagnetic layers being conductive, the third magnetic layer being provided between one of the plurality of third nonmagnetic layers and an other one of the plurality of third nonmagnetic layers, a direction from the one of the plurality of third nonmagnetic layers toward the other one of the plurality of third nonmagnetic layers being aligned with the first direction.

2. The electronic device according to claim 1, further comprising a connection member electrically connected to the second element,
the second member having a hole,
the connection member overlapping the hole in the first direction.

3. The electronic device according to claim 1, further comprising a first base material,
the first base material being between the first element and the second member in the first direction,
the second member contacting the first base material.

4. The electronic device according to claim 3, further comprising a connection member,
the second member having a hole,
the first base material including a first base material electrode,
the connection member electrically connecting the first base material electrode and the second element via the hole.

5. The electronic device according to claim 4, wherein
the first base material further includes a first base material insulating layer, and the first base material insulating layer is between the second member and the second element and between the first base material electrode and the second member.

6. The electronic device according to claim 4, wherein
a thickness of the first base material electrode is substantially the same as a thickness of the one of the plurality of second nonmagnetic layers, and
a material of the first base material electrode is substantially the same as a material of the one of the plurality of second nonmagnetic layers.

7. The electronic device according to claim 4, wherein an absolute value of a difference between a thickness of the first base material electrode and a thickness of the one of the plurality of second nonmagnetic layers is not more than ½ of an absolute value of a difference between the thickness of the one of the plurality of second nonmagnetic layers and a thickness of the other one of the plurality of second nonmagnetic layers.

8. The electronic device according to claim 3, further comprising a first base material side member, a first base material opposite side member, a first base material other-side member, and a first base material opposite other-side member,
the first base material being between the first base material side member and the first base material opposite side member in a second direction crossing the first direction,
the first base material being between the first base material other-side member and the first base material opposite other-side member in a third direction crossing a plane including the first direction and the second direction,
the first base material side member including a plurality of first base material side nonmagnetic layers and a first base material side magnetic layer, the plurality of first base material side nonmagnetic layers being conductive, the first base material side magnetic layer being provided between one of the plurality of first base material side nonmagnetic layers and an other one of the plurality of first base material side nonmagnetic layers, a direction from the one of the plurality of first base material side nonmagnetic layers toward the other one of the plurality of first base material side nonmagnetic layers being aligned with the second direction,
the first base material opposite side member including a plurality of first base material opposite side nonmagnetic layers and a first base material opposite side magnetic layer, the plurality of first base material opposite side nonmagnetic layers being conductive, the first base material opposite side magnetic layer being provided between one of the plurality of first base material opposite side nonmagnetic layers and an other one of the plurality of first base material opposite side nonmagnetic layers, a direction from the one of the plurality of first base material opposite side nonmagnetic layers toward the other one of the plurality of first base material opposite side nonmagnetic layers being aligned with the second direction,
the first base material other-side member including a plurality of first base material other-side nonmagnetic layers and a first base material other-side magnetic layer, the plurality of first base material other-side nonmagnetic layers being conductive, the first base material other-side magnetic layer being provided between one of the plurality of first base material other-side nonmagnetic layers and an other one of the plurality of first base material other-side nonmagnetic layers, a direction from the one of the plurality of first base material other-side nonmagnetic layers toward the other one of the plurality of first base material other-side nonmagnetic layers being aligned with the third direction,
the first base material opposite other-side member including a plurality of first base material opposite other-side nonmagnetic layers and a first base material opposite other-side magnetic layer, the plurality of first base material opposite other-side nonmagnetic layers being conductive, the first base material opposite other-side magnetic layer being provided between one of the plurality of first base material opposite other-side nonmagnetic layers and an other one of the plurality of first base material opposite other-side nonmagnetic layers, a direction from the one of the plurality of first base material opposite other-side nonmagnetic layers toward the other one of the plurality of first base material opposite other-side nonmagnetic layers being aligned with the third direction.

9. The electronic device according to claim 1, further comprising an insulating member including a portion provided between the second element and the second member.

10. The electronic device according to claim 9, wherein the second element is between the second member and an other portion of the insulating member in the first direction.

11. The electronic device according to claim 1, further comprising a first side member, a first opposite side member, a first other-side member, and a first opposite other-side member,
the first element being between the first side member and the first opposite side member in a second direction crossing the first direction,
the first element being between the first other-side member and the first opposite other-side member in a third direction crossing a plane including the first direction and the second direction,
the first side member including a plurality of first side nonmagnetic layers and a first side magnetic layer, the plurality of first side nonmagnetic layers being conductive, the first side magnetic layer being provided between one of the plurality of first side nonmagnetic layers and an other one of the plurality of first side nonmagnetic layers, a direction from the one of the plurality of first side nonmagnetic layers toward the other one of the plurality of first side nonmagnetic layers being aligned with the second direction,
the first opposite side member including a plurality of first opposite side nonmagnetic layers and a first opposite side magnetic layer, the plurality of first opposite side nonmagnetic layers being conductive, the first opposite side magnetic layer being provided between one of the plurality of first opposite side nonmagnetic layers and an other one of the plurality of first opposite side nonmagnetic layers, a direction from the one of the plurality of first opposite side nonmagnetic layers toward the other one of the plurality of first opposite side nonmagnetic layers being aligned with the second direction,
the first other-side member including a plurality of first other-side nonmagnetic layers and a first other-side magnetic layer, the plurality of first other-side nonmagnetic layers being conductive, the first other-side magnetic layer being provided between one of the plurality of first other-side nonmagnetic layers and an other one of the plurality of first other-side nonmagnetic layers, a direction from the one of the plurality of first other-side nonmagnetic layers toward the other one of the plurality of first other-side nonmagnetic layers being aligned with the third direction, the first opposite other-side member including a plurality of first opposite other-side nonmagnetic layers and a first opposite other-side magnetic layer, the plurality of first opposite other-side nonmagnetic layers being conductive, the first opposite other-side magnetic layer being provided between one of the plurality of first opposite other-side nonmagnetic layers and an other one of the plurality of first opposite other-side nonmagnetic layers, a direction from the one of the plurality of first opposite other-side nonmagnetic layers toward the other one of the plurality of first opposite other-side nonmagnetic layers being aligned with the third direction.

12. The electronic device according to claim 1, further comprising a third element,
the third member being between the second element and the third element in the first direction.

13. The electronic device according to claim 1, wherein at least a portion of the first magnetic layer includes $Fe_{100-x1-x2}\alpha_{x1}N_{x2}$,
α includes at least one selected from the group consisting of Zr, Hf, Ta, Nb, Ti, Si, and Al,
x1 is not less than 0.5 and not more than 10, and
x2 is not less than 0.5 and not more than 8.

14. The electronic device according to claim 1, wherein the first member further includes an other first magnetic layer,
the other one of the plurality of first nonmagnetic layers is between the first magnetic layer and the other first magnetic layer in the first direction, and
an orientation of a magnetization of the first magnetic layer crosses an orientation of a magnetization of the other first magnetic layer.

15. An electronic device, comprising:
a first member;
a second member;
a first element; and
a first insulating member,
a direction from the first member toward the second member being aligned with a first direction,
the first element being between the first member and the second member in the first direction,
the first insulating member being between the first member and the first element in the first direction,
the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction,
the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction.

16. The electronic device according to claim 15, further comprising a first side member and a first opposite side member,
the first element being between the first side member and the first opposite side member in a second direction crossing the first direction,
the first side member including a plurality of first side nonmagnetic layers and a first side magnetic layer, the plurality of first side nonmagnetic layers being conductive, the first side magnetic layer being provided between one of the plurality of first side nonmagnetic layers and an other one of the plurality of first side nonmagnetic layers, a direction from the one of the plurality of first side nonmagnetic layers toward the other one of the plurality of first side nonmagnetic layers being aligned with the second direction,
the first opposite side member including a plurality of first opposite side nonmagnetic layers and a first opposite side magnetic layer, the plurality of first opposite side nonmagnetic layers being conductive, the first opposite side magnetic layer being provided between one of the plurality of first opposite side nonmagnetic layers and an other one of the plurality of first opposite side nonmagnetic layers, a direction from the one of the plurality of first opposite side nonmagnetic layers toward the other one of the plurality of first opposite side nonmagnetic layers being aligned with the second direction.

17. The electronic device according to claim 15, further comprising a first other-side member and a first opposite other-side member,
the first element being between the first other-side member and the first opposite other-side member in a third direction crossing a plane including the first direction and the second direction,
the first other-side member including a plurality of first other-side nonmagnetic layers and a first other-side magnetic layer, the plurality of first other-side nonmagnetic layers being conductive, the first other-side magnetic layer being provided between one of the plurality of first other-side nonmagnetic layers and an other one of the plurality of first other-side nonmagnetic layers, a direction from the one of the plurality of first other-side nonmagnetic layers toward the other one of the plurality of first other-side nonmagnetic layers being aligned with the third direction,
the first opposite other-side member including a plurality of first opposite other-side nonmagnetic layers and a first opposite other-side magnetic layer, the plurality of first opposite other-side nonmagnetic layers being conductive, the first opposite other-side magnetic layer being provided between one of the plurality of first opposite other-side nonmagnetic layers and an other one of the plurality of first opposite other-side nonmagnetic layers, a direction from the one of the plurality of first opposite other-side nonmagnetic layers toward the other one of the plurality of first opposite other-side nonmagnetic layers being aligned with the third direction.

18. The electronic device according to claim 16, further comprising a second insulating member,
the first insulating member being between the first member and the second insulating member in the first direction,
the first element being between the first insulating member and the second insulating member in the first direction, the second member being between the first element and the second insulating member in the first direction.

19. The electronic device according to claim 18, wherein the first side member is between the first element and a portion of the second insulating member in the second direction, and
the first opposite side member is between the first element and an other portion of the second insulating member in the second direction.

20. An electronic device, comprising:
a first member;
a second member;
a first element; and
a second element,
a direction from the first member toward the second member being aligned with a first direction,
a direction from the second element toward the first element crossing the first direction,
the first element being between a portion of the first member and a portion of the second member in the first direction,
the second element being between an other portion of the first member and an other portion of the second member in the first direction,
the first member including a plurality of first nonmagnetic layers and a first magnetic layer, the plurality of first nonmagnetic layers being conductive, the first magnetic layer being provided between one of the plurality of first nonmagnetic layers and an other one of the plurality of first nonmagnetic layers, a direction from the one of the plurality of first nonmagnetic layers toward the other one of the plurality of first nonmagnetic layers being aligned with the first direction,
the second member including a plurality of second nonmagnetic layers and a second magnetic layer, the plurality of second nonmagnetic layers being conductive, the second magnetic layer being provided between one of the plurality of second nonmagnetic layers and an other one of the plurality of second nonmagnetic layers, a direction from the one of the plurality of second nonmagnetic layers toward the other one of the plurality of second nonmagnetic layers being aligned with the first direction.

\* \* \* \* \*